United States Patent
Yang

(10) Patent No.: US 10,096,565 B2
(45) Date of Patent: Oct. 9, 2018

(54) METHOD FOR FABRICATING GLASS SUBSTRATE PACKAGE

(71) Applicant: Ping-Jung Yang, Hsin-Chu (TW)

(72) Inventor: Ping-Jung Yang, Hsin-Chu (TW)

(73) Assignee: Ping-Jung Yang, HsinChu (TW)

( * ) Notice: Subject to any disclaimer, the term of this patent is extended or adjusted under 35 U.S.C. 154(b) by 0 days.

(21) Appl. No.: 15/476,999

(22) Filed: Apr. 1, 2017

(65) Prior Publication Data
US 2017/0207188 A1 Jul. 20, 2017

Related U.S. Application Data

(63) Continuation of application No. 14/036,256, filed on Sep. 25, 2013, now Pat. No. 9,615,453.

(60) Provisional application No. 61/705,649, filed on Sep. 26, 2012.

(51) Int. Cl.
*H01L 23/00* (2006.01)
*H01G 4/12* (2006.01)
*H05B 33/08* (2006.01)

(52) U.S. Cl.
CPC .......... *H01L 24/30* (2013.01); *H01G 4/129* (2013.01); *H01L 24/46* (2013.01); *H01L 24/49* (2013.01); *H05B 33/0896* (2013.01); *H01L 2224/056* (2013.01); *H01L 2224/05688* (2013.01); *H01L 2224/05788* (2013.01); *H01L 2224/32151* (2013.01); *H01L 2224/32225* (2013.01)

(58) Field of Classification Search
CPC ....... H05K 1/09; H01L 23/15; H01L 51/0096; H01L 2224/0401; H01L 24/30; H01L 24/46; H01L 24/49; H01L 2224/056; H01L 2224/05688; H01L 2224/05788; H01L 2224/32151; H01L 2224/32225; H01G 4/129; H05B 33/0896
USPC ............................................ 361/762; 1/762
See application file for complete search history.

(56) References Cited

U.S. PATENT DOCUMENTS

| | | |
|---|---|---|
| 4,221,047 A | 9/1980 | Narken et al. |
| 4,639,543 A | 1/1987 | Fang |
| 4,975,103 A | 12/1990 | Ackermann et al. |
| 5,294,238 A | 3/1994 | Fukada et al. |
| 5,705,855 A | 1/1998 | Carson et al. |
| 6,156,413 A | 12/2000 | Tomari et al. |
| 6,177,707 B1 | 1/2001 | Dekker et al. |
| 6,194,762 B1 | 2/2001 | Yamazaki et al. |
| 6,309,901 B1 | 10/2001 | Tahon et al. |
| 6,339,197 B1 | 1/2002 | Fushie et al. |
| 6,539,750 B1 | 4/2003 | Takagi et al. |
| 6,673,698 B1 | 1/2004 | Lin et al. |

(Continued)

*Primary Examiner* — Michael P McFadden

(57) ABSTRACT

A substrate comprising a solid glass core having a first surface and a second surface opposed to the first surface; multiple conductors extending through the solid glass core beginning at the first surface and ending at the second surface, wherein one of the conductors has a third surface and a fourth surface, wherein the third surface and the first surface are substantially coplanar, wherein the second surface and the fourth surface are substantially coplanar, wherein one of the conductors comprise a copper-tungsten alloy material, wherein the solid glass core is directly contact with the conductor; and a first dielectric layer and a first metal layer formed at the first surface, wherein the first metal layer at the first surface is electrically coupled with one of the conductors.

20 Claims, 44 Drawing Sheets

(56) References Cited

U.S. PATENT DOCUMENTS

| | | | |
|---|---|---|---|
| 6,691,409 B2 | 2/2004 | Suzuki et al. | |
| 6,772,514 B2 | 8/2004 | Ogura et al. | |
| 6,799,438 B2 | 10/2004 | Herzbach et al. | |
| 6,839,946 B2 | 1/2005 | Ylilammi et al. | |
| 6,894,358 B2 | 5/2005 | Leib et al. | |
| 6,989,604 B1 | 1/2006 | Woo et al. | |
| 7,038,309 B2 | 5/2006 | Hsu et al. | |
| 7,071,521 B2 | 7/2006 | Leib et al. | |
| 7,072,018 B2 | 7/2006 | Mori et al. | |
| 7,091,589 B2 | 8/2006 | Mori et al. | |
| 7,259,080 B2 | 8/2007 | Quenzer et al. | |
| 7,279,771 B2 | 10/2007 | Sunohara et al. | |
| 7,285,834 B2 | 10/2007 | Leib et al. | |
| 7,337,540 B2 | 3/2008 | Kurosawa | |
| 7,362,403 B2 | 4/2008 | Uehara | |
| 7,476,623 B2 | 1/2009 | Schreder et al. | |
| 7,749,900 B2 | 7/2010 | Li et al. | |
| 7,808,799 B2* | 10/2010 | Kawabe | H01L 23/49822 174/250 |
| 7,993,510 B2 | 8/2011 | En | |
| 8,207,453 B2 | 6/2012 | Ma et al. | |
| 2002/0038725 A1 | 4/2002 | Suzuki et al. | |
| 2002/0145197 A1 | 10/2002 | Ohta et al. | |
| 2002/0159243 A1 | 10/2002 | Ogawa et al. | |
| 2005/0012217 A1 | 1/2005 | Mori et al. | |
| 2006/0006539 A1* | 1/2006 | Matsui | H01L 23/481 257/758 |
| 2006/0020371 A1* | 1/2006 | Ham | B01L 3/502761 700/266 |
| 2008/0054457 A1 | 3/2008 | Lin et al. | |
| 2008/0079461 A1* | 4/2008 | Lin | H01L 21/76816 326/80 |
| 2008/0080111 A1 | 4/2008 | Lin et al. | |
| 2008/0113505 A1* | 5/2008 | Sparks | H01L 21/76898 438/637 |
| 2008/0129439 A1* | 6/2008 | Nishikawa | H01F 17/0013 336/232 |
| 2008/0149384 A1 | 6/2008 | Kawabe | |
| 2008/0150623 A1 | 6/2008 | Lin et al. | |
| 2008/0283277 A1 | 11/2008 | Muramatsu et al. | |
| 2008/0284014 A1 | 11/2008 | Lin et al. | |
| 2008/0318361 A1 | 12/2008 | Han et al. | |
| 2009/0174065 A1 | 7/2009 | Hayashi et al. | |
| 2009/0273073 A1 | 11/2009 | Tachibana et al. | |
| 2010/0164030 A1 | 7/2010 | Oggioni et al. | |
| 2010/0200898 A1 | 8/2010 | Lin et al. | |
| 2010/0246152 A1 | 9/2010 | Lin et al. | |
| 2010/0290191 A1 | 11/2010 | Lin et al. | |
| 2011/0026232 A1 | 2/2011 | Lin et al. | |
| 2011/0089574 A1* | 4/2011 | Itoh | H01L 23/3677 257/774 |
| 2011/0147055 A1* | 6/2011 | Ma | H01L 21/4803 174/255 |
| 2012/0112361 A1* | 5/2012 | Han | H01L 23/481 257/774 |
| 2012/0212919 A1* | 8/2012 | Mano | H05K 1/185 361/782 |
| 2013/0303777 A1* | 11/2013 | Okamoto | C07F 15/002 548/103 |

\* cited by examiner

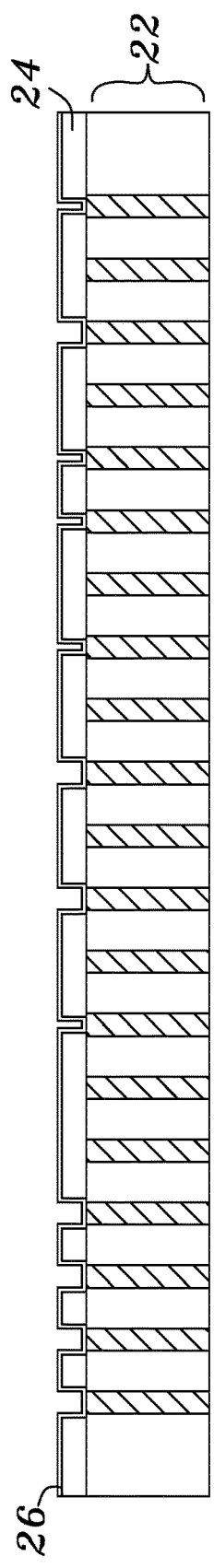
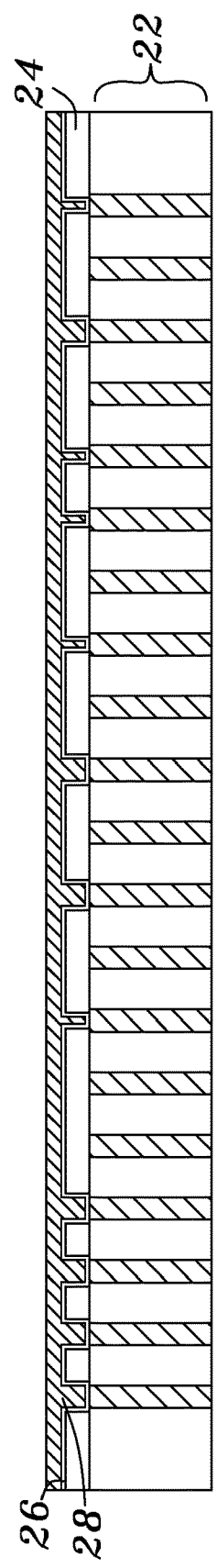
Fig. 18c
Fig. 18d

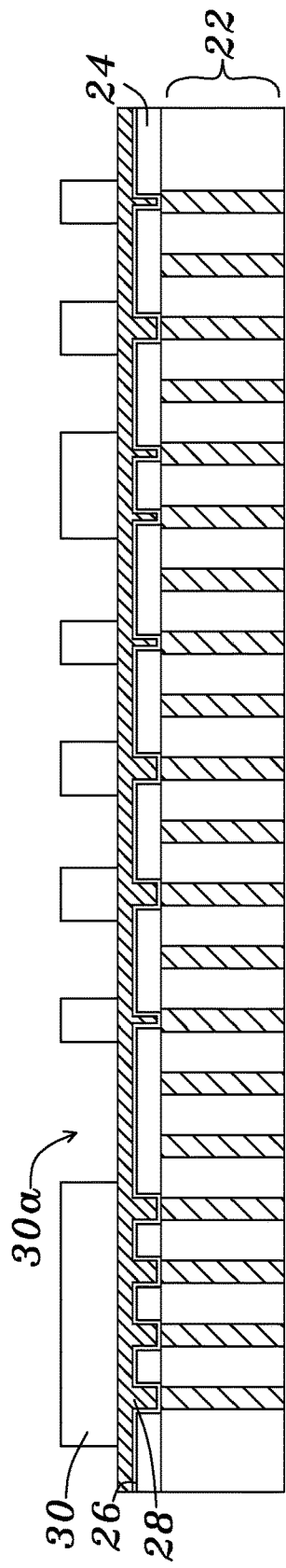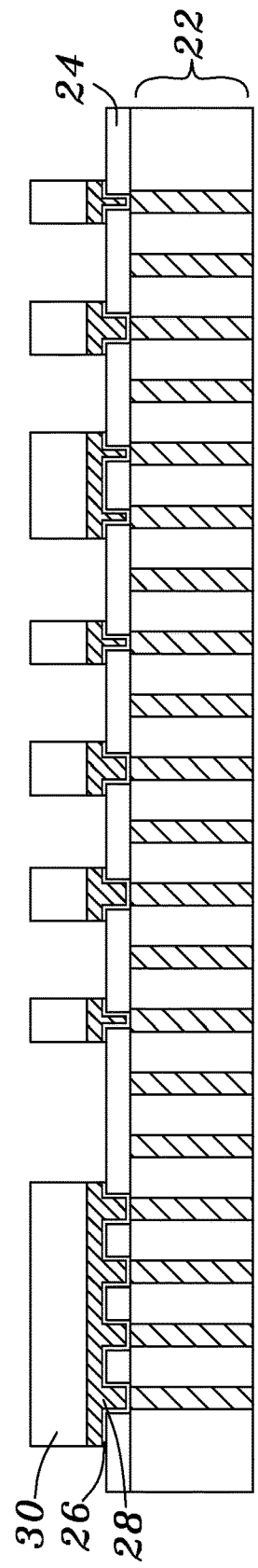
Fig. 18e
Fig. 18f

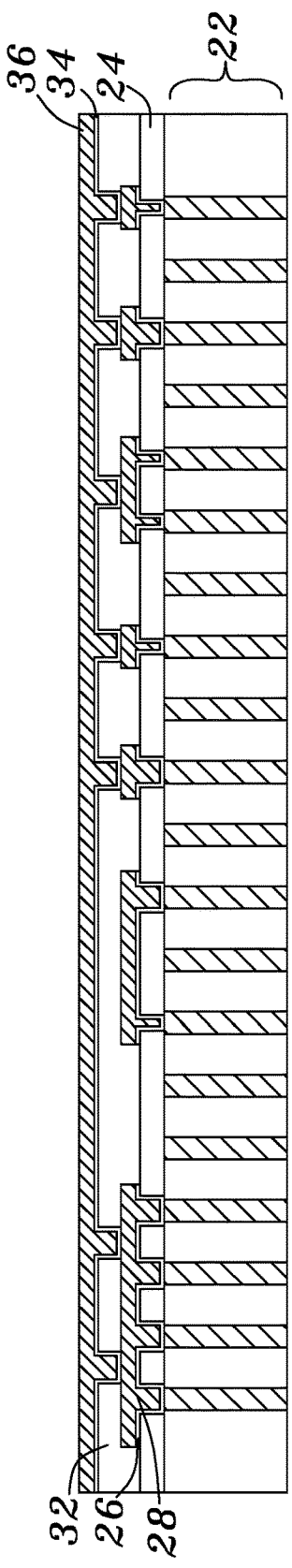
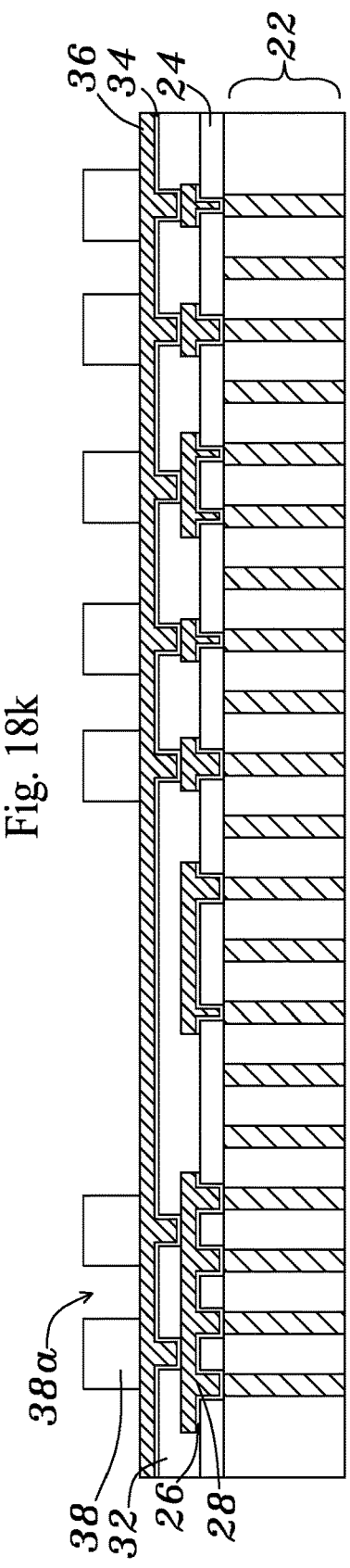
Fig. 18k
Fig. 18l

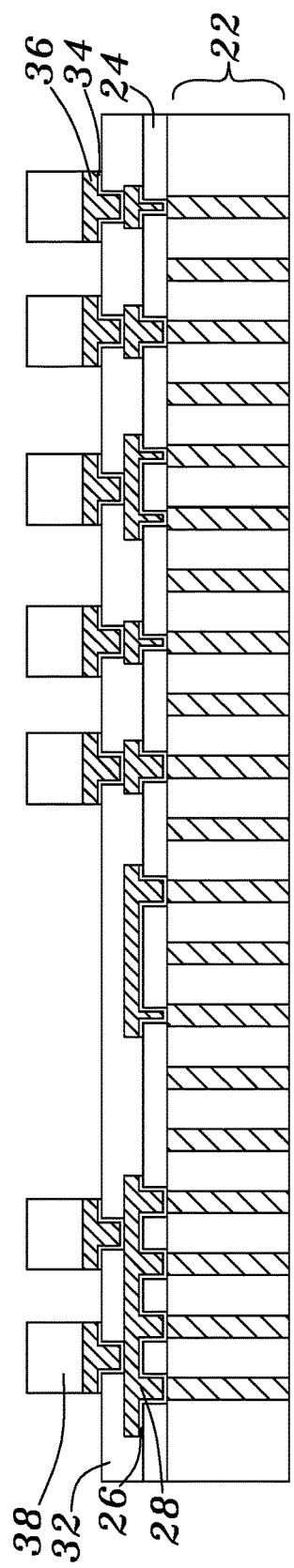
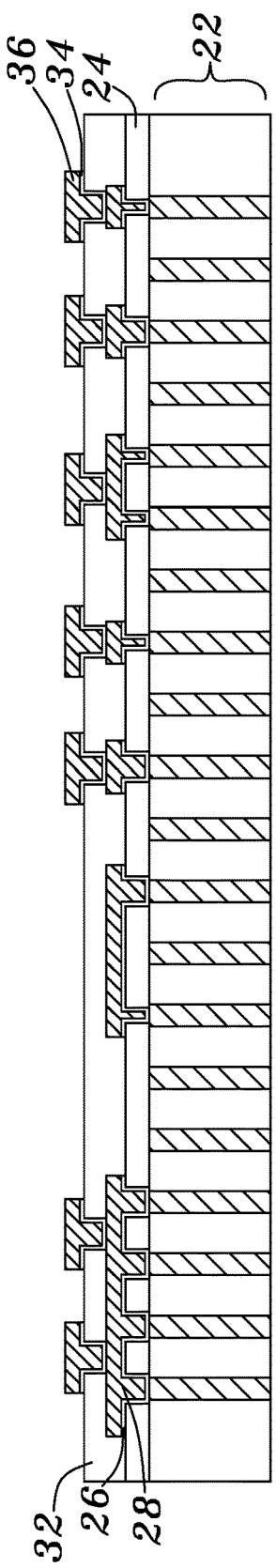
Fig. 18m
Fig. 18n

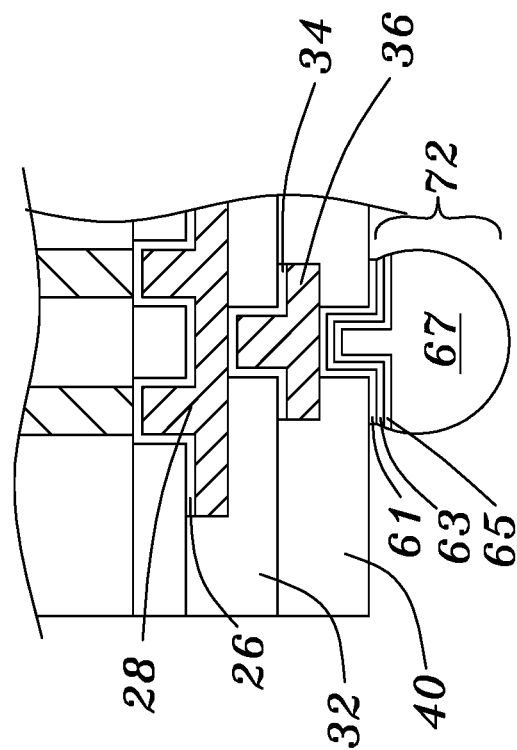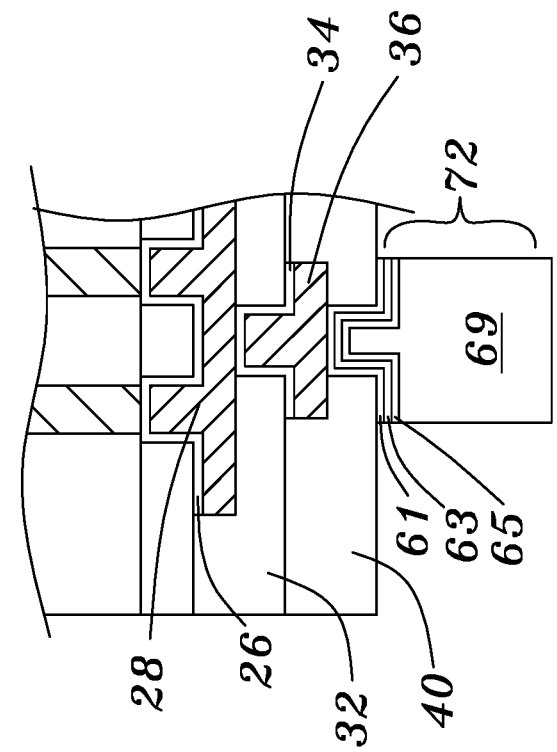
Fig. 18w

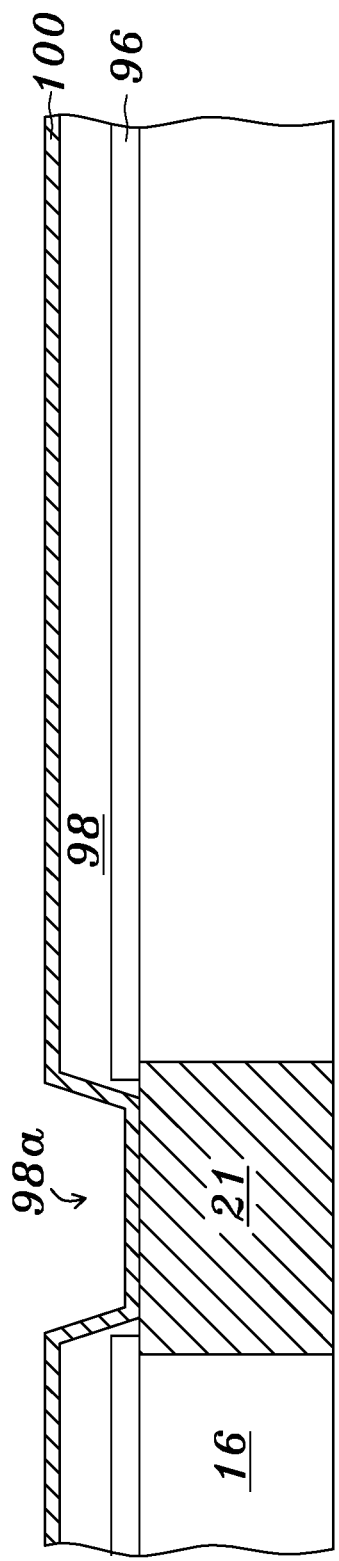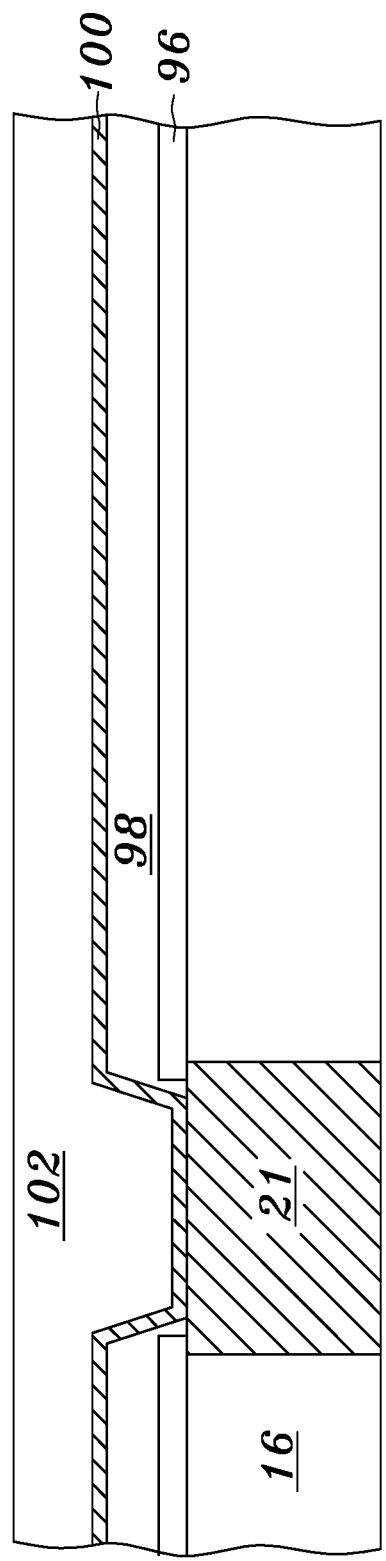

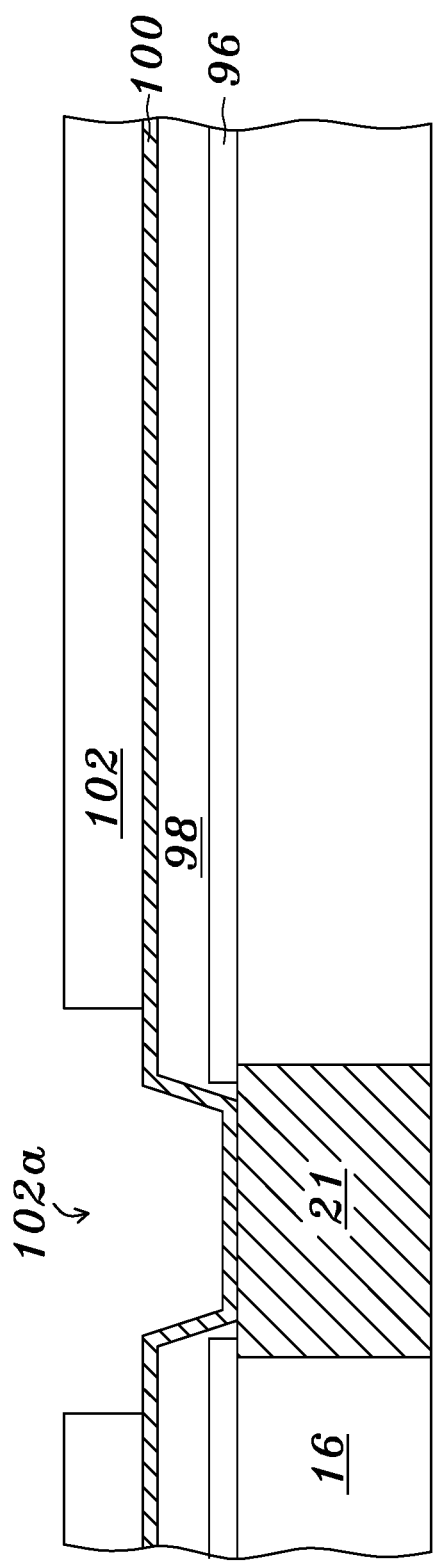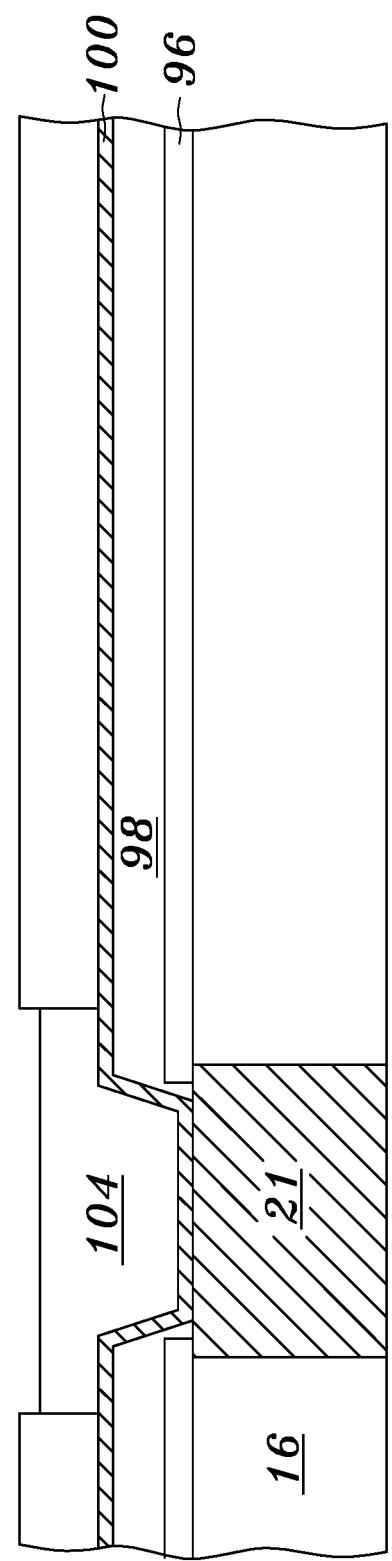

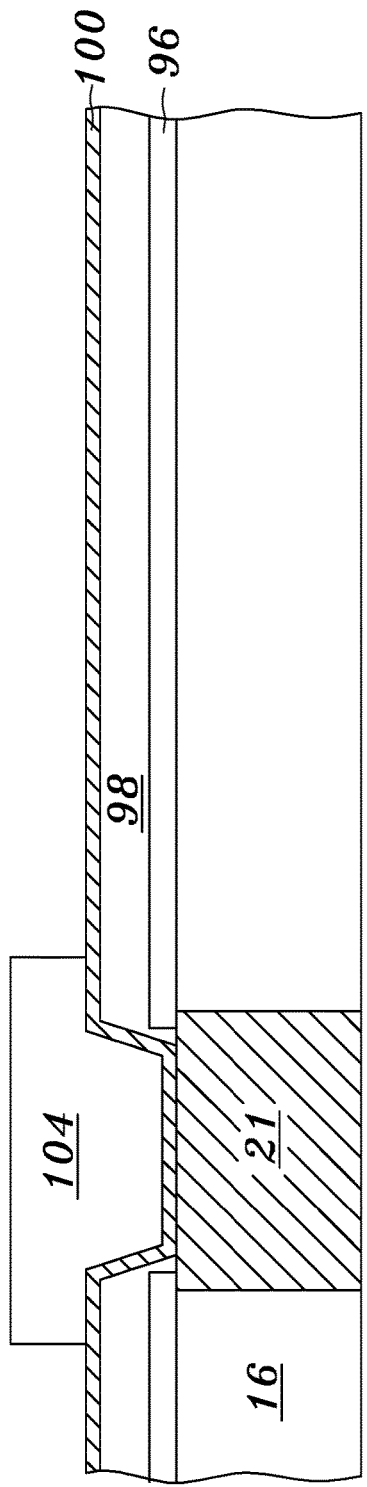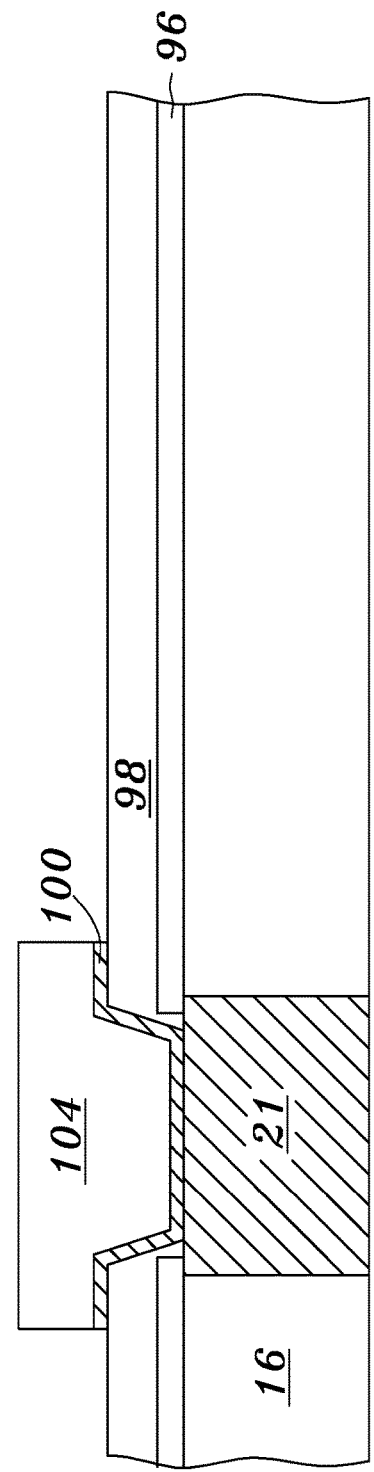

METHOD FOR FABRICATING GLASS SUBSTRATE PACKAGE

CROSS-REFERENCE TO RELATED APPLICATIONS

This application is a continuation of application Ser. No. 14/036,256, filed on Sep. 25, 2013, now pending, which claims the benefit of priority from U.S. Provisional Patent Application No. 61/705,649 filed on Sep. 26, 2012, all of which are incorporated herein by reference in their entirety.

BACKGROUND OF THE DISCLOSURE

Field of the Disclosure

The patent disclosure a method and structure to manufacture a glass substrate, and disclosed embodiments relate to one or more chip building a system on the glass substrate.

Brief Description of the Related Art

As is well known, microelectronic devices have a tendency to be minimized and thinned with its functional development and a semiconductor package mounted on a mother board is also following the tendency in order to realize a mounting of high integration.

When the geometric dimensions of the Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines.

Increased Input-Output (IO) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Temperature Coefficient of Expansion) matching to avoid solder bump fatigue are still challenges.

Glass can be used as an interposer to bridge between one or more IC chips and a printed circuit board. In many respects, when used as an interposer/substrate and without the requirement for active devices, glass can be a good substitute for a silicon interposer. The advantages of glass in comparison to silicon as an interposer lie in its much lower material cost. Glass also has a CTE closely matched to silicon, so that reliability of interconnects, especially microbonds, can be expected to be quite good. Glass has some disadvantages in comparison to silicon—notably its lower thermal conductivity and the difficulty in forming Through Glass Vias (TGV's). Both of these topics are discussed elsewhere in this patent.

SUMMARY OF THE DISCLOSURE

Embodiments of the present disclosure provide a substrate comprising a solid glass core having a first surface and a second surface opposed to the first surface; multiple conductors extending through the solid glass core beginning at the first surface and ending at the second surface, wherein one of the conductors has a third surface and a fourth surface, wherein the third surface and the first surface are substantially coplanar, wherein the second surface and the fourth surface are substantially coplanar, wherein one of the conductors comprise a copper-tungsten alloy material, wherein the solid glass core is directly contact with the conductor; and a first dielectric layer and a first metal layer formed at the first surface, wherein the first metal layer at the first surface is electrically coupled with one of the conductors.

Embodiments of the present disclosure provide a substrate comprising a solid glass core having a first surface and a second surface opposed to the first surface; multiple conductors extending through the solid glass core beginning at the first surface and ending at the second surface, wherein one of the conductors has a third surface and a fourth surface, wherein the third surface and the first surface are substantially coplanar, wherein the second surface and the fourth surface are substantially coplanar, wherein one of the conductors comprise a first metal layer and a second metal layer coated the first metal layer, wherein the solid glass core is directly contact with the conductor; and a first dielectric layer and a third metal layer formed at the first surface, wherein the first third layer at the first surface is electrically coupled with one of the conductors.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure.

FIGS. 20a-20i illustrates an embossing process to form the metal layer on the glass substrate, in accordance with the present disclosure.

Figure 1:
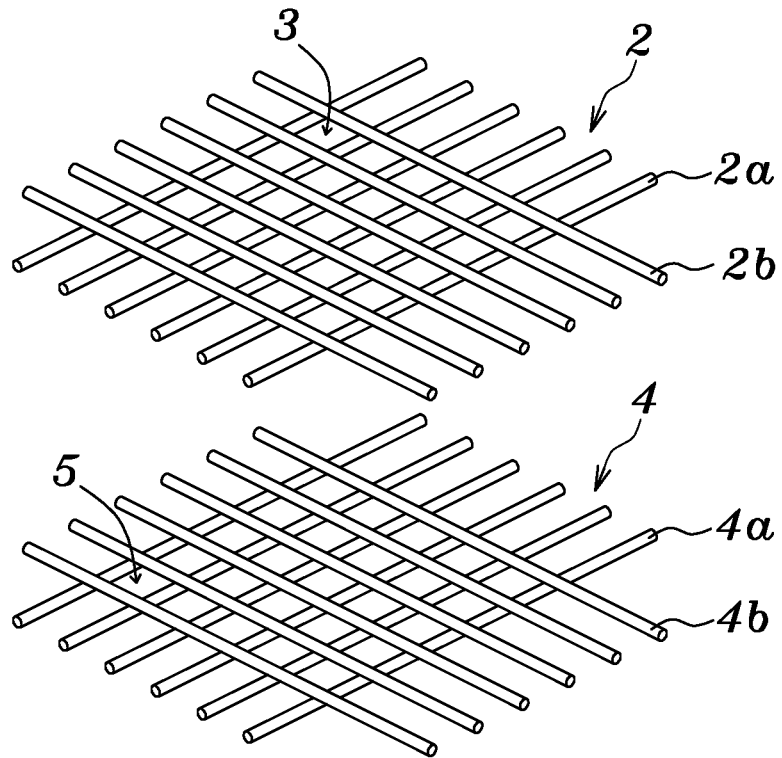
FIG. 1 illustrates a three-dimensional view of a X-axis nets and a Y-axis nets, in accordance with the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE DISCLOSURE

FIG. 1 illustrates a three-dimensional view of a net 2, 4, wherein the net 4 is under the net 2, wherein the net 2 comprises multiple Y-axis traces 2a and multiple X-axis traces 2b under the Y-axis traces 2a, and wherein the net 4 comprises multiple Y-axis traces 4a and multiple X-axis traces 4b under the Y-axis traces 4a. Multiple gaps 3, 5 form in the net 2 and 4. Each of the traces 2a, 2b, 4a and 4b is easily move to change the size of gaps 3 and gaps 5. The diameter (or width) of traces 2a, 2b, 4a and 4b are the same, such as between 10 and 30 micrometers, between 20 and 100 micrometers, between 40 and 150 micrometers, between 50 and 200 micrometers, between 200 and 1000 micrometers or between 500 and 10000 micrometers. The traces 2a, 2b, 4a and 4b may be metal traces or polymer traces, such as copper traces, copper-gold alloy traces, copper-gold-palladium alloy traces, copper-gold-silver alloy traces, copper-platinum alloy traces, copper-iron alloy traces, copper-nickel alloy traces, copper-tungsten traces, tungsten traces, brass wires, zinc plated brass wires, stainless wires, nickel plated stainless wires, phosphor bronze wires, copper plated the aluminum wires, aluminum traces, phenolic resin traces, epoxy resin traces, melamine-formaldehyde resin traces or polysiloxanes resin traces. The cross-section shape of traces 2a, 2b, 4a and 4b may be a circular shape, a Square shape, an oblong shape, a rectangle shape or a flat shape.

Figure 2:
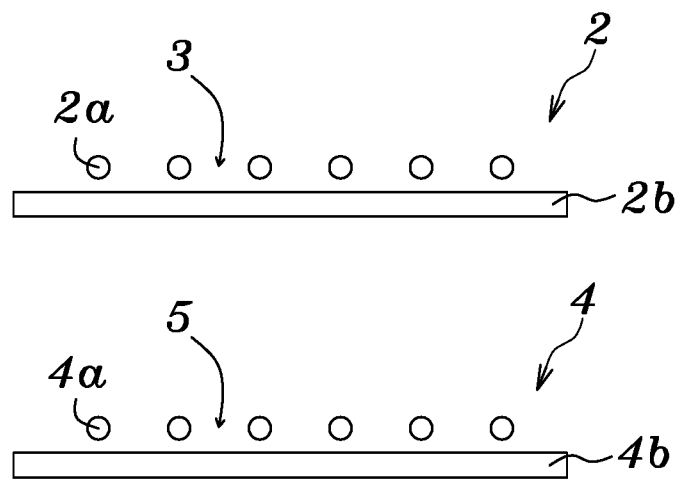
FIG. 2 illustrates a cross-section view of the X-axis nets and the Y-axis nets, in accordance with the present disclosure.

FIG. 2 illustrates a cross-section view of the net 2 and the net 4. The gaps 3 and gaps 5 are aligned with each other.

Figure 3:
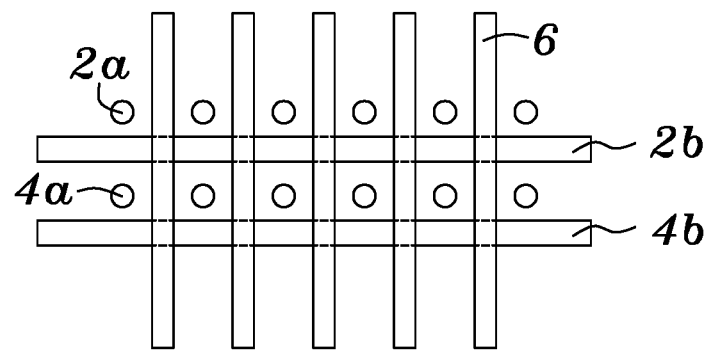
FIG. 3 illustrates a cross-section view of the Z-axis traces crossed to the X-axis nets and the Y-axis nets, in accordance with the present disclosure.

Next, referring to FIG. 3, multiple metal traces 6 are crossed the net 2 and the net 4 through the gaps 3 and gaps 5. The diameter (or width) of metal traces 6 is between 10 and 30 micrometers, between 20 and 100 micrometers, between 40 and 150 micrometers, between 50 and 200 micrometers, between 200 and 1000 micrometers or between 500 and 10000 micrometers. The traces 6 may be metal traces, such as copper traces, copper-gold alloy traces, copper-gold-palladium alloy traces, copper-gold-silver alloy traces, copper-platinum alloy traces, copper-iron alloy traces, copper-nickel alloy traces, copper-tungsten traces, tungsten traces, brass wires, zinc plated brass wires, stainless wires, nickel plated stainless wires, phosphor bronze wires, copper plated the aluminum wires, aluminum traces, titanium-containing layer plated the copper wires, tantalum-containing layer plated the copper wires. The cross-section shape of traces 6 may be a circular shape, a square shape, an oblong shape, a rectangle shape or a flat shape. The diameter (or width) of traces 6 may be the same with the traces 2a, 2b, 4a and 4b or different with the traces 2a, 2b, 4a and 4b.

Furthermore, we proposed the material of the traces 6 is copper-tungsten alloy, wherein the copper in the copper-tungsten alloy is 50 percent and the tungsten in the copper-tungsten alloy is 50 percent, the copper in the copper-tungsten alloy is 60 percent and the tungsten in the copper-tungsten alloy is 40 percent, the copper in the copper-tungsten alloy is 70 percent and the tungsten in the copper-tungsten alloy is 30 percent, the copper in the copper-tungsten alloy is 80 percent and the tungsten in the copper-tungsten alloy is 20 percent, the copper in the copper-tungsten alloy is 90 percent and the tungsten in the copper-tungsten alloy is 10 percent, the copper in the copper-tungsten alloy is 40 percent and the tungsten in the copper-tungsten alloy is 60 percent, the copper in the copper-tungsten alloy is 30 percent and the tungsten in the copper-tungsten alloy is 70 percent.

Figure 4:
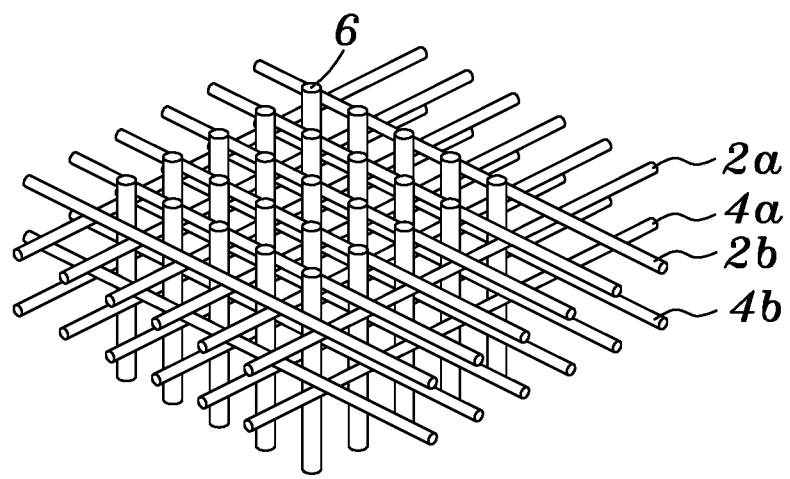
FIG. 4 illustrates a three-dimensional view of the Z-axis traces, X-axis nets and the Y-axis nets, in accordance with the present disclosure.

FIG. 4 illustrates a three-dimensional view of a net 2, 4 and traces 6.

Figure 5C:
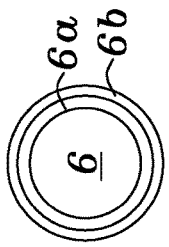
FIG. 5a-5i illustrate the shape and structure of the Z-axis traces, in accordance with the present disclosure.
Figure 5F:
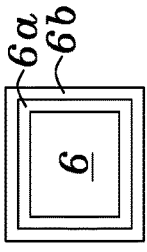
Figure 5I:
Figure 5B:
Figure 5E:
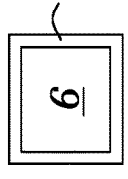
Figure 5H:
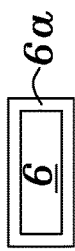
Figure 5A:
Figure 5D:
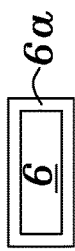
Figure 5G:

FIG. 5a-5i illustrates the shape and structure of the traces 6. In FIG. 5a, the cross-section shape of traces 6 is a circular shape. In FIG. 5d, the cross-section shape of traces 6 is a square shape. In FIG. 5g, the cross-section shape of traces 6 is an oblong shape. In FIG. 5b, the cross-section shape of traces 6 is a circular shape and a first covering layer 6a is cover on the traces 6, wherein the first covering layer 6a may be a metal layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5e, the cross-section shape of traces 6 is a square shape and a first covering layer 6a is cover on the traces 6, wherein the first covering layer 6a may be a metal layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5h, the cross-section shape of traces 6 is an oblong shape and a first covering layer 6a is cover on the traces 6, wherein the first covering layer 6a may be a metal layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5c, the cross-section shape of traces 6 is a circular shape and a second covering layer 6b is cover on the first covering layer 6a, wherein the second covering layer 6b may be an adhesion layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5f, the cross-section shape of traces 6 is a square shape and a second covering layer 6b is cover on the first covering layer 6a, wherein the second covering layer 6b may be an adhesion layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5i, the cross-section shape of traces 6 is an oblong shape and a second covering layer 6b is cover on the first covering layer 6a, wherein the second covering layer 6b may be an adhesion layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer.

Figure 6:
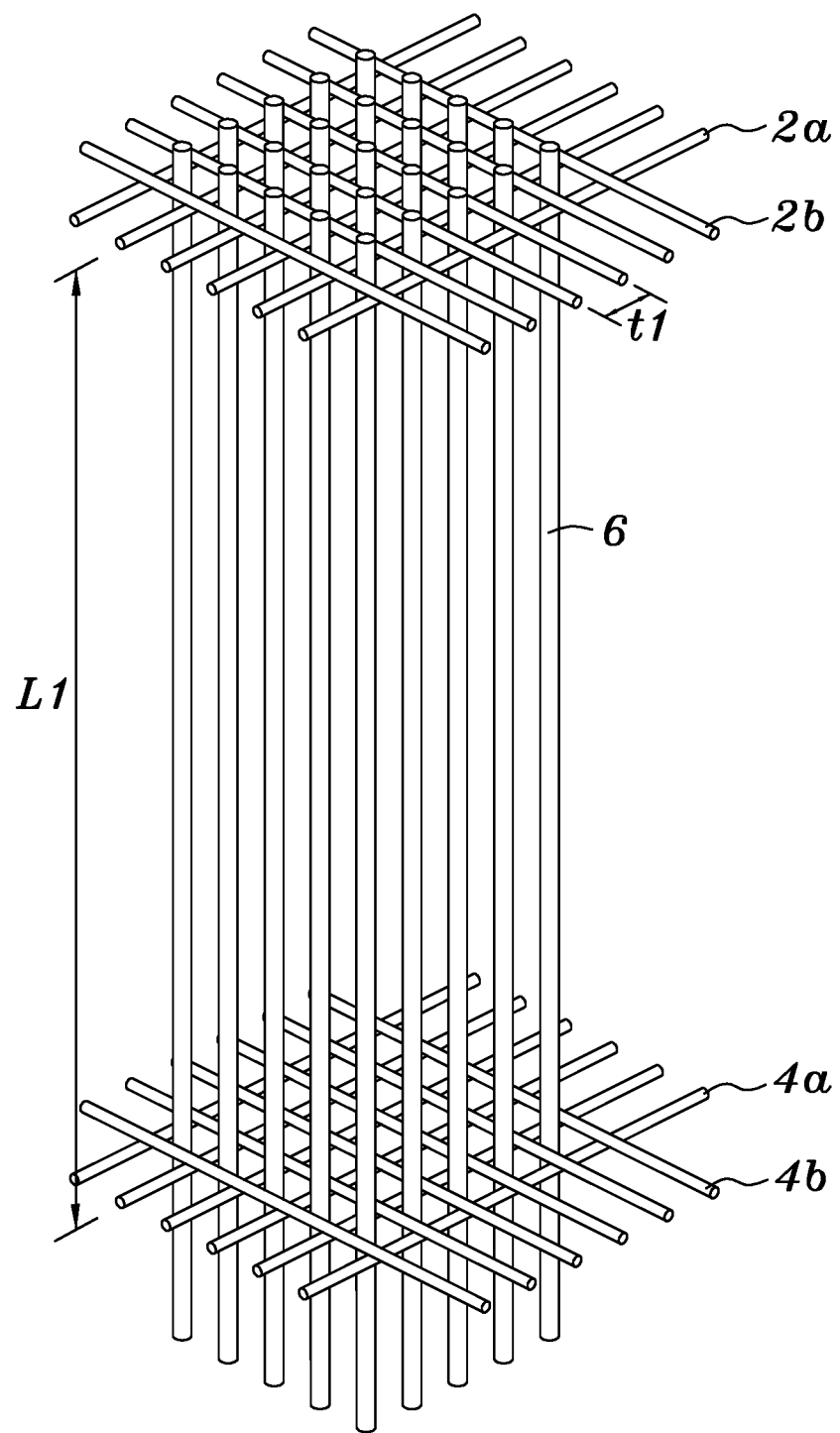
FIGS. 6-15 are illustrate a process of forming a glass substrate, in accordance with the present disclosure.

Next, referring to FIG. 6, the traces 6 are stretched to a suitable length L1, e.g., smaller than 5 meters, such as between 0.5 and 1 meter, or between 1 and 3 meters. In the same time, the net 4 is moved down to a suitable location. The pitch t1 between the traces 2a, 2b, 4a, 4b is greater than the diameter (or width) of traces 6.

Figure 7:
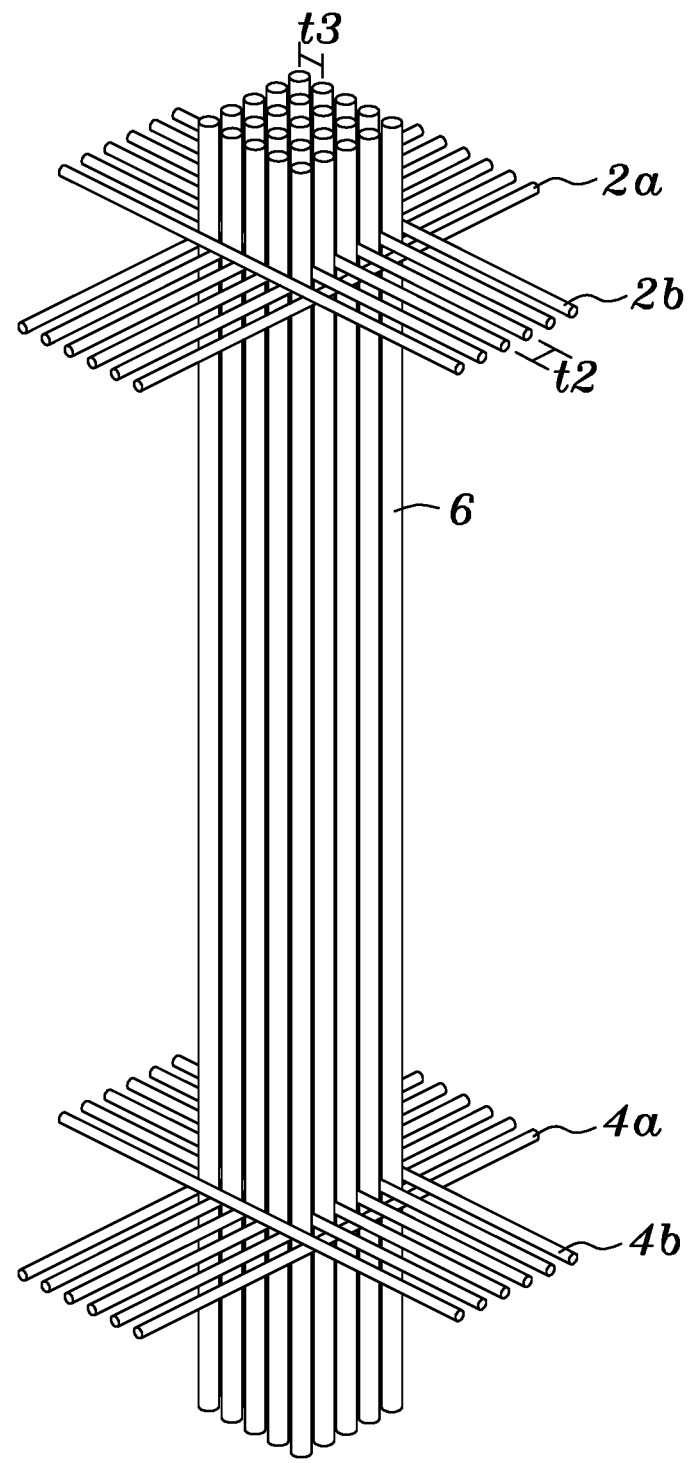

Next, referring to FIG. 7, the traces 2a, 2b, 4a and 4b are moved to change the pitch t1 to a pitch t2, then the traces 6 are closed up to a pitch t3. The pitch t3 substantially the same with the diameter (or width) of the traces 2a, 2b, 4a and 4b, such as between 5 and 20 micrometers, between 20 and 50 micrometers, between 30 and 80 micrometers, between 20 and 100 micrometers, between 40 and 150 micrometers, between 50 and 200 micrometers, between 200 and 1000 micrometers or between 500 and 10000 micrometers. In the same time, may be apply a force to stretch the traces 6, 2a, 2b, 4a and 4b and make the traces 6 keep strength and keep the pitch t3 fixed.

Figure 8:
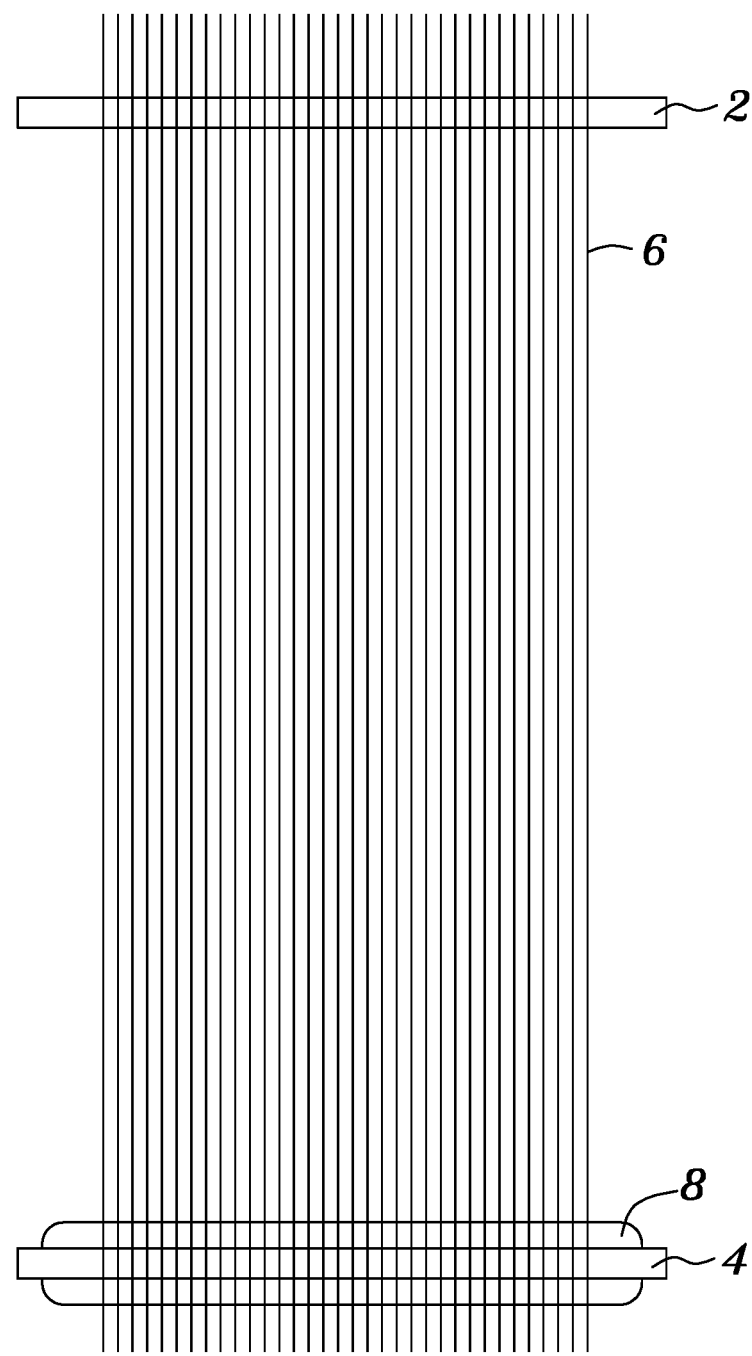

Next, referring to FIG. 8, a thermal resistance layer 8 is formed on surfaces of the net 4. The thermal resistance layer 8 may be a polymer layer, such as a thermosetting resin, phenolic resin, epoxy resin, melamine-formaldehyde resin, polysiloxanes resin, plaster layer, wherein the thermal resistance layer 8 has a heat deflection temperature between 400 and 900° C. When a liquid thermal resistance layer 8 formed on the net 4 and the thermal resistance layer 8 permeated the net 4 through the gaps 5, wherein the thermal resistance layer 8 cover the gaps 5 between traces 4a, traces 4b and traces 6, then curing the thermal resistance layer 8. The thermal resistance layer 8 has a thickness between 0.05 and 1 meter.

Figure 9:
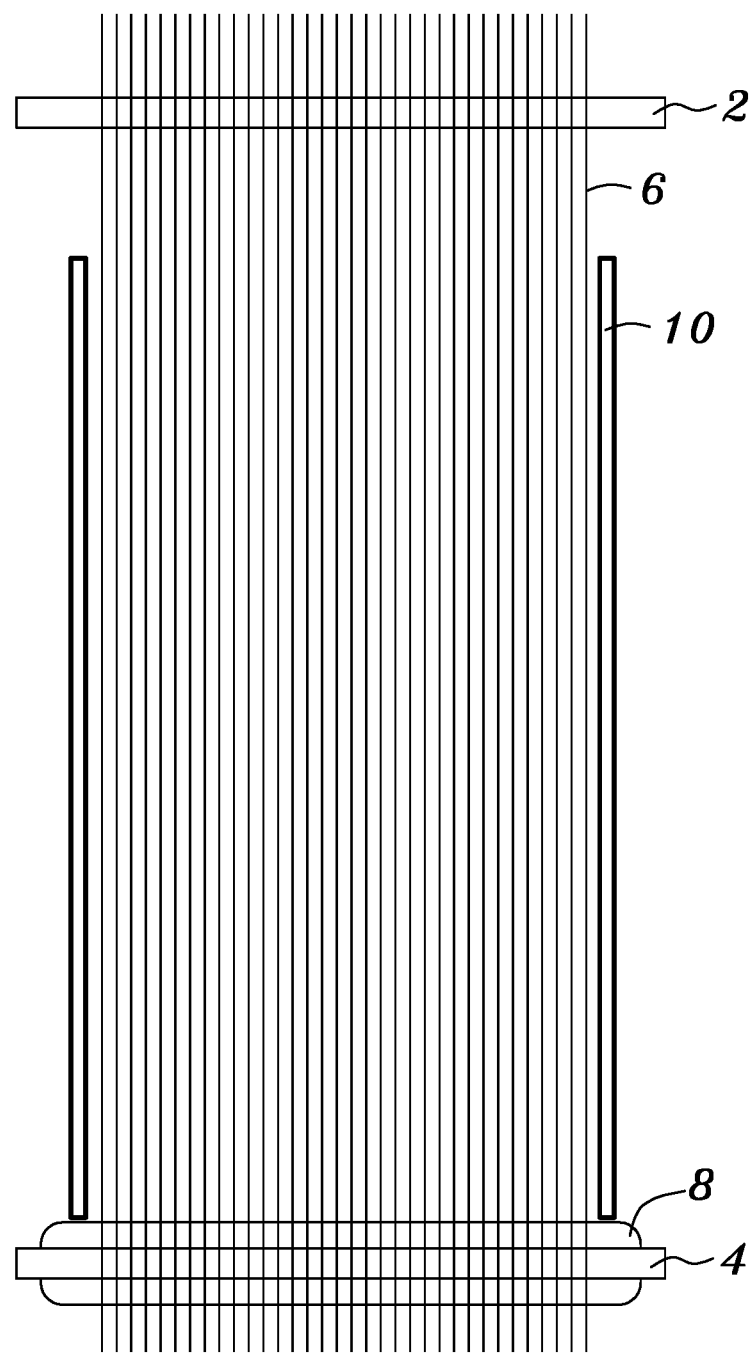

Next, referring to FIG. 9, a mold 10 is provided between the net 2 and the net 4, wherein the mold 10 surrounds the traces 6 and on the thermal resistance layer 8. The mold 10 is hold up by a machine or a device. The mold 10 may be a metal mold, a ceramics mold or a polymer mold, which has a heat deflection temperature between 400° C. and 900° C. or between 800° C. and 1300° C.

Figure 10:
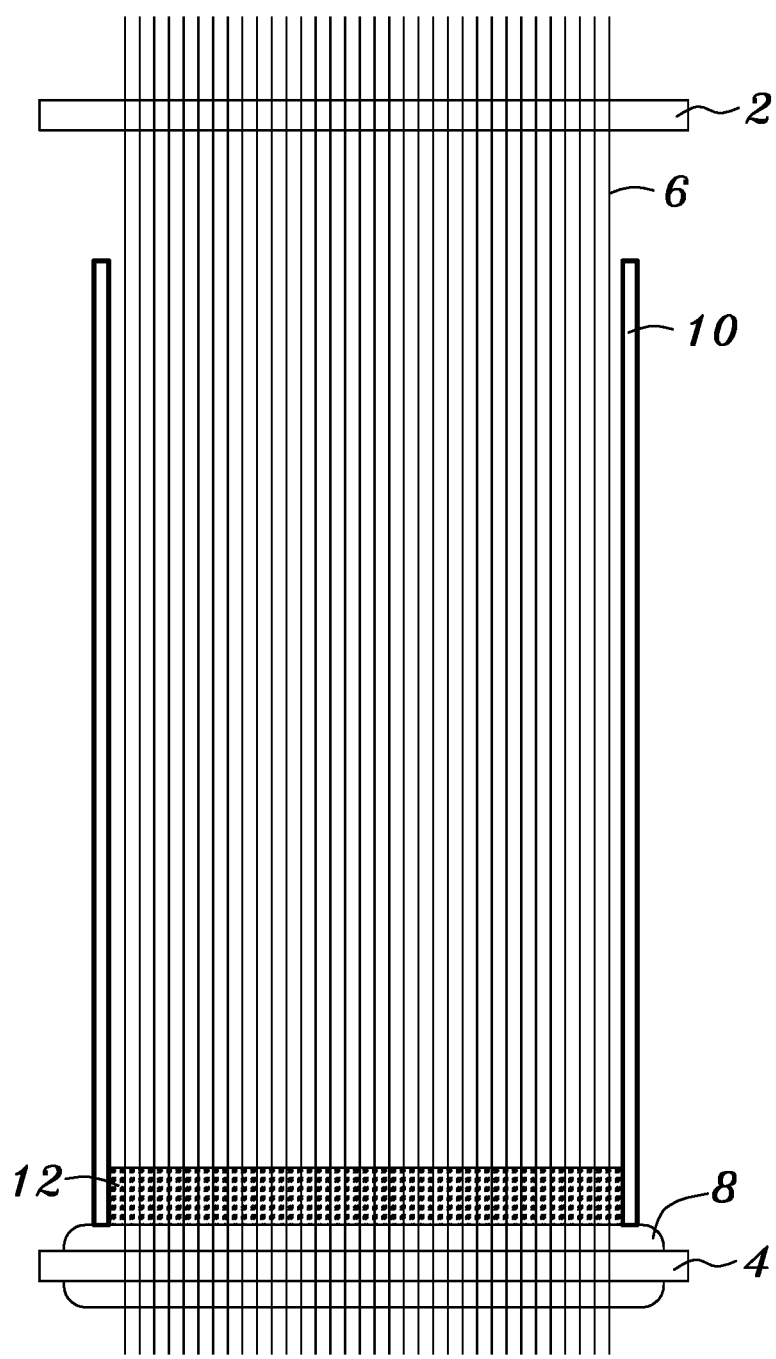

Next, referring to FIG. 10, a fixed layer 12 is formed on the thermal resistance layer 8, wherein the fixed layer 12 may be a glass layer or a polymer layer. When the material of the fixed layer 12 is glass, the fixed layer 12 is a high temperature liquid to form on the thermal resistance layer 8, and then the fixed layer 12 down to a suitable temperature becomes a solid state. The fixed layer 12 has a thickness between 0.01 and 1 meter. The bottom of traces 6 are fixed by the fixed layer 12.

Figure 11:
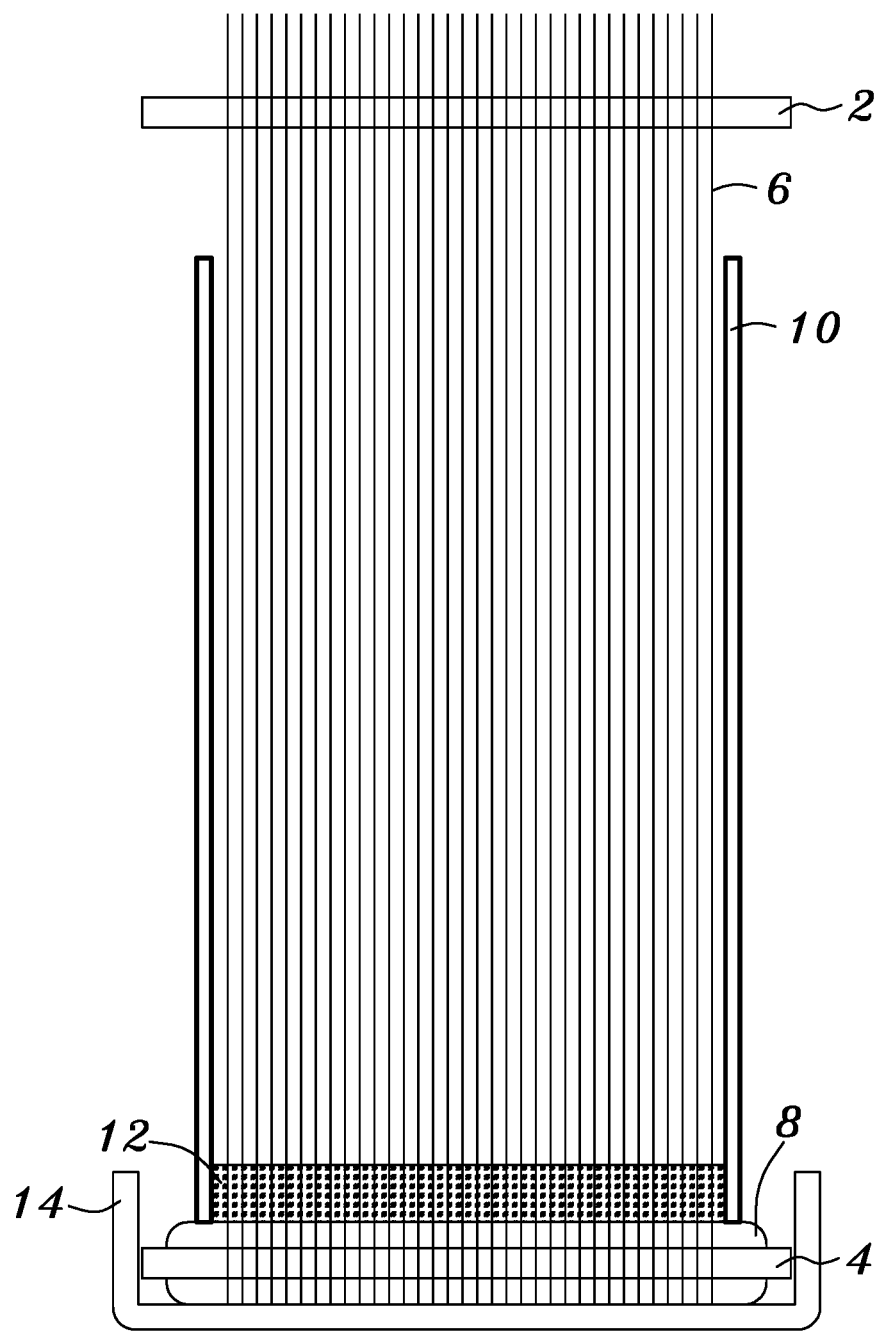

Next, referring to FIG. 11, the traces 6 under the net 4 are cut. A tank 14 carries the mold 10, net 4 and the fixed layer 12.

Figure 12:
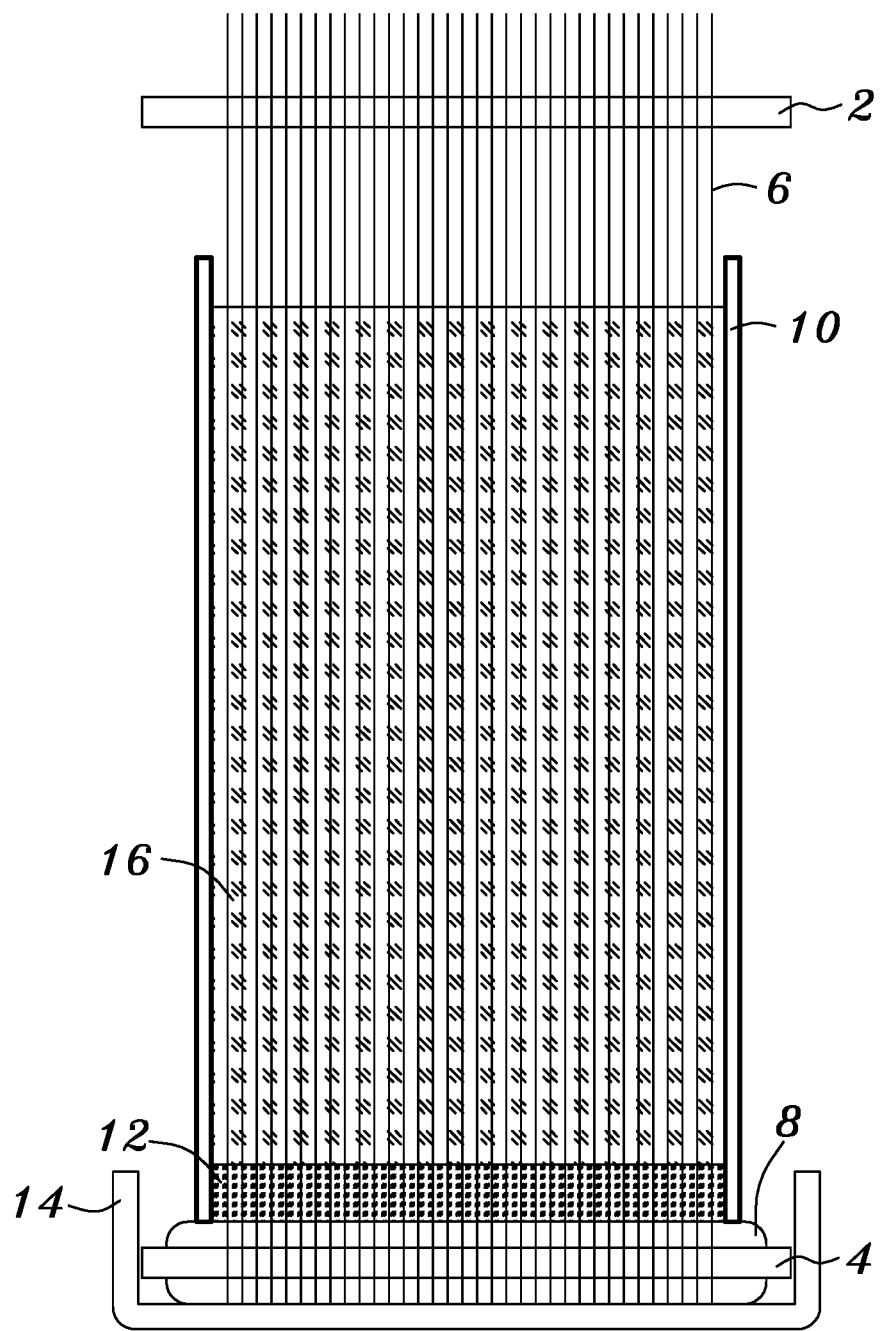

Next, referring to FIG. 12, a glass layer (liquid form) 16 is formed on the fixed layer 12. The glass layer 16 is a high temperature liquid to form on the fixed layer 12 and fill in the mold 10, and then the glass layer 16 down to a suitable temperature becomes a solid state, wherein the glass layer 16 has a glass transition temperature between 300° C. and 900° C., between 500° C. and 800° C., between 900° C. and 1200° C. or between 1000° C. and 1800° C. The glass layer 16 is a low melting point glass material, wherein the glass layer 16 has a melting point between 300° C. and 900° C., 800° C. and 1300° C., between 900° C. and 1600° C., between 1000° C. and 1850° C., or between 1000° C. and 2000° C., wherein the melting point may smaller than 1500° C. The glass layer 16 has a thickness greater than 0.5 meters or greater than 0.1 meter. Furthermore, there is a few bubbles or no bubble in glass layer 16, for example, there is zero to 3 bubbles in one cubic meter of the glass layer 16, 1 to 10 bubbles in one cubic meter of the glass layer 16, 5 to 30 bubbles in one cubic meter of the glass layer 16 or 20 to 60 bubbles in one cubic meter of the glass layer 16, wherein the bubble has a diameter between 0.0001 and 0.001 centimeters, between 0.001 and 0.05 centimeters, between 0.05 and 0.1 centimeters or between 0.05 and 0.5 centimeters. The glass layer 16 may be remove bubbles through multiple laminating process, squeezing process and heating process.

The glass layer 16 refers to an amorphous solid. The material of the glass layer 16 may be included soda-lime glass, boro-silicate glass, alumo-silicate glass, fluoride glasses, phosphate glasses or chalcogen glasses. For example, the composition of the soda-lime glass comprises $SiO_2$ (74%), $Na_2O$ (13%), CaO (10.5%), $Al_2O_3$ (1.3%), $K_2O$ (0.3%), SO3 (0.2%), MgO (0.2%), Fe2O3 (0.04%), TiO2 (0.01%), the composition of the boro-silicate glass comprises $SiO_2$ (81%), $B_2O_3$ (12%), $Na_2O$ (4.5%), $Al_2O_3$ (2.0%), the composition of the phosphate glasses comprises a percentage of the $P_2O_5$ material between 3% and 10% or between 5% and 20%.

A glass, once formed into a solid body, is capable of being softened and perhaps remitted into a liquid form. The "glass transition temperature" of a glass material is a temperature below which the physical properties of the glass are similar to those of a solid and above which the glass material behaves like a liquid.

If a glass is sufficiently below the glass transition temperature, molecules of the glass may have little relative mobility. As a glass approaches the glass transition temperature, the glass may begin to soften and with increasing temperature the glass will ultimately melt into the liquid state. Thus, a glass body may be softened to an extent sufficient to enable manipulation of the body's shape, allowing for the formation of holes or other features in the glass body. Once the desired form is obtained, glass is usually annealed for the removal of stresses. Surface treatments, coatings or lamination may follow to improve the chemical durability (glass container coatings, glass container internal treatment), strength (toughened glass, bulletproof glass, windshields), or optical properties (insulated glazing, antireflective coating).

Furthermore, the glass layer 16 may be replaced by a polymer layer. When the polymer cured to a solid state. The polymer layer has an expansion coefficient between 3 and 10 ppm/° C.

Figure 13:
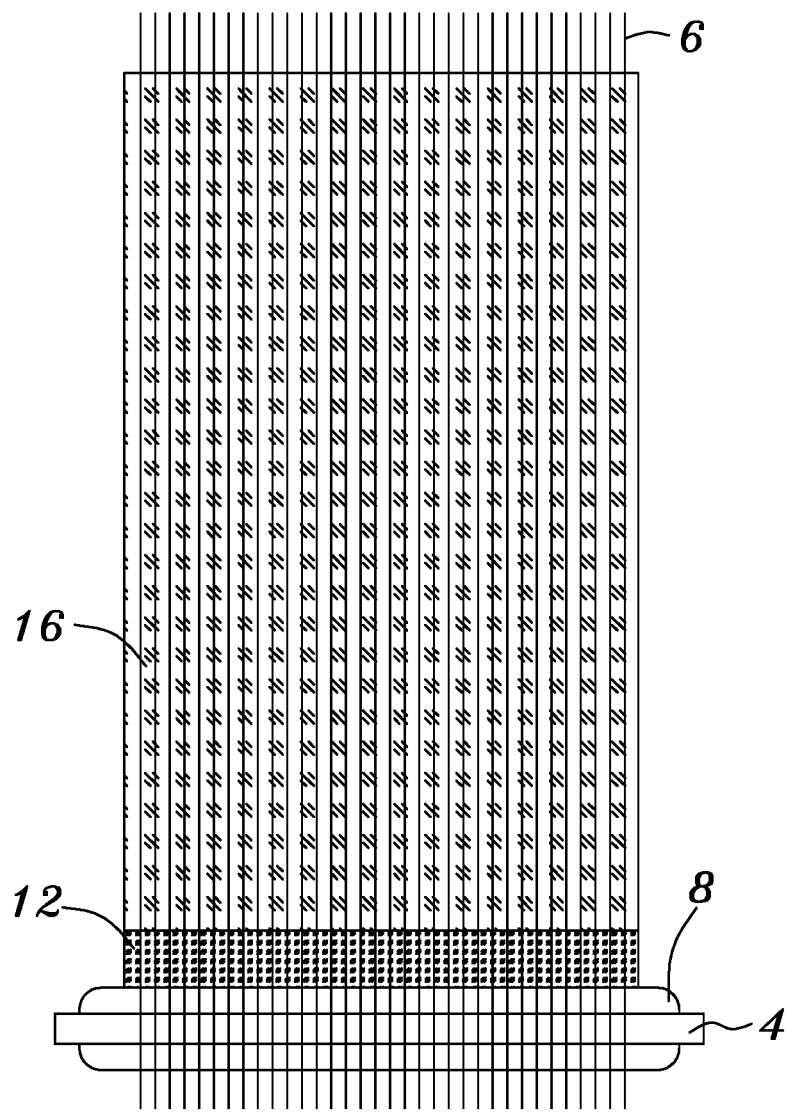

Next, referring to FIG. 13, the mold 10 and the tank 14 are removed and cut the traces 6 from net 2.

Figure 14:
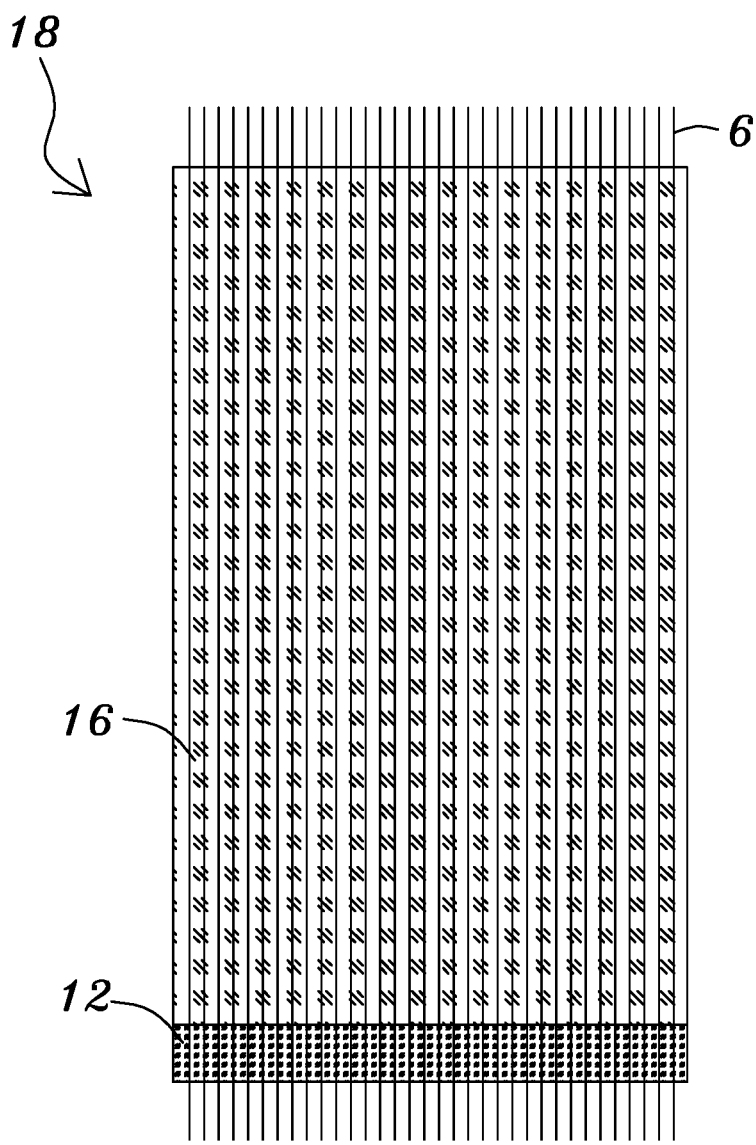

Next, referring to FIG. 14, the net 4 and the thermal resistance layer 8 are removed, and then a column 8 is produced.

Figure 15:
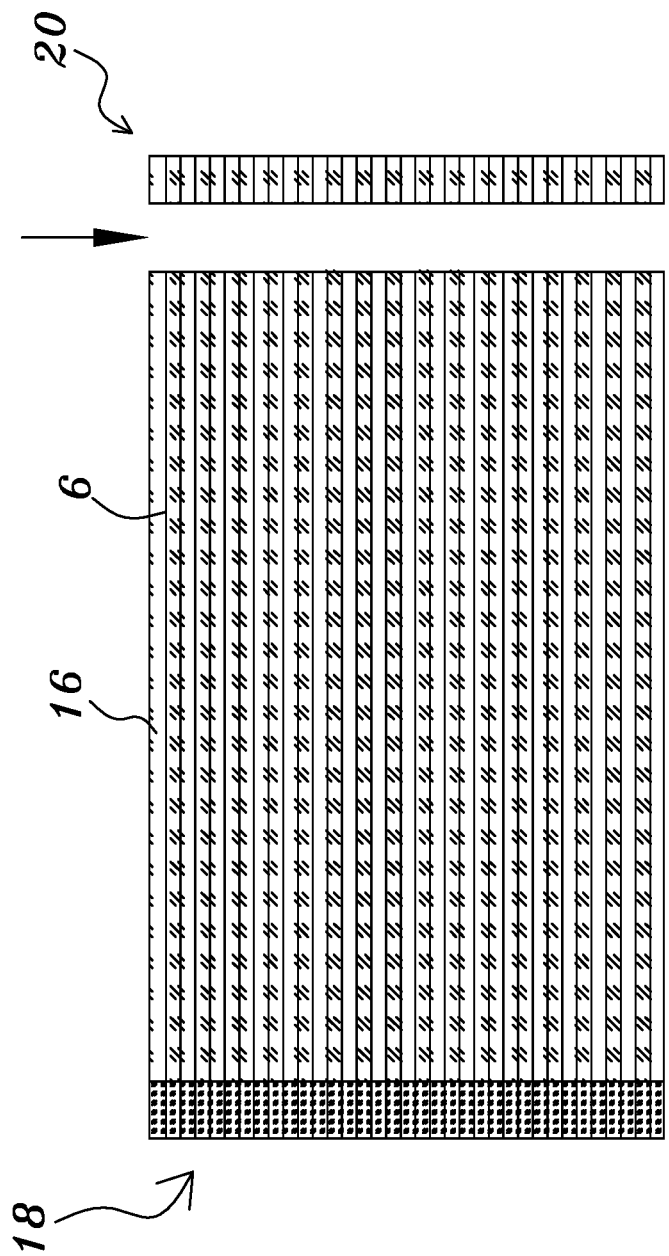
Figure 16A:
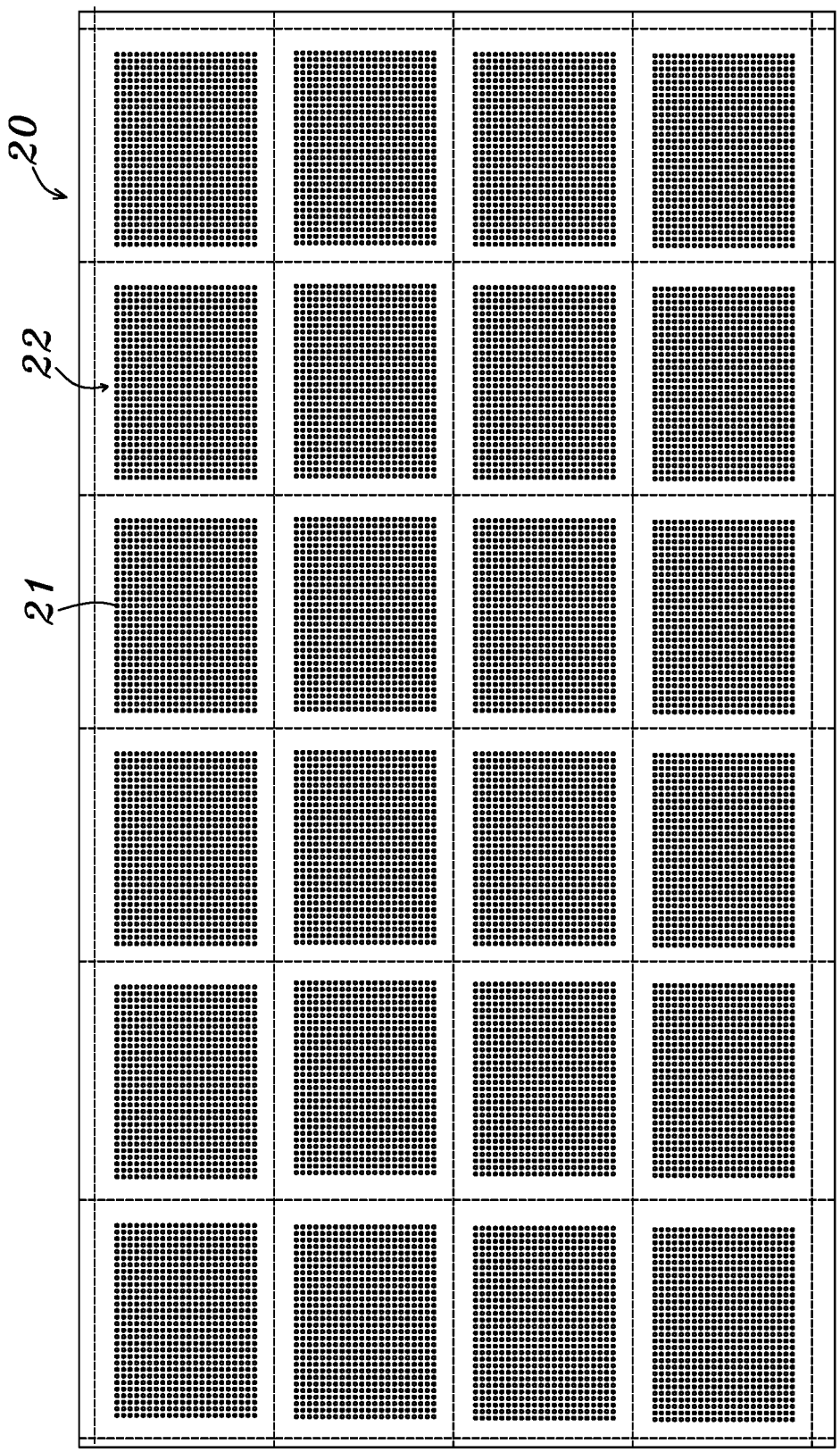
FIGS. 16a-16d illustrate a top views of the glass substrate, in accordance with the present disclosure.

Next, referring to FIG. 15, the traces 6 out of the column 8 are removed and cutting the column 8 to produce multiple first substrates 20, wherein the first substrate 20 has a thickness between 20 and 100 micrometers, between 50 and 150 micrometers, between 100 and 300 micrometers or between 150 and 2000 micrometers or greater than 1000 micrometers. The first substrates 20 may be make a planarization process using a suitable process, such as a chemical mechanical polishing (CMP) procedure, mechanical grinding, or laser drilling Next, referring to FIG. 16a, the first substrate 20 comprises multiple second substrates 22. The second substrates 22 are well-regulated an array in the first substrate 20. Each of the second substrates has multiple metal plugs 21, wherein the metal plug 21 is formed from metal traces 6. The metal plug 21 has the same material and structure with metal trace 6.

Figure 16D:
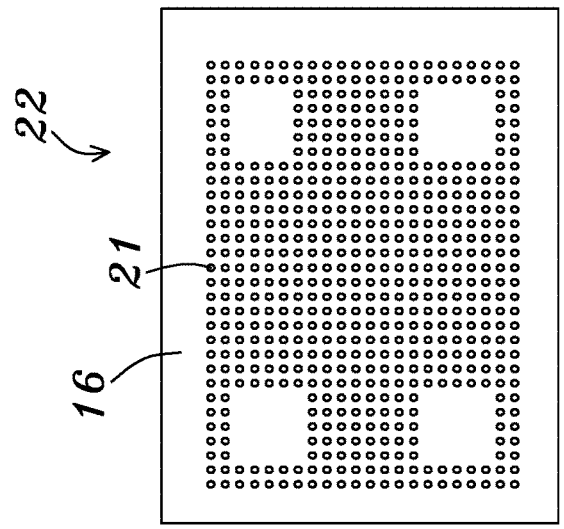
Figure 16C:
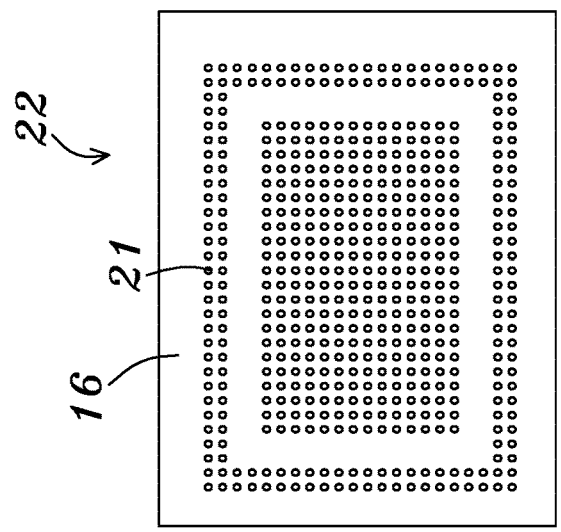
Figure 16B:
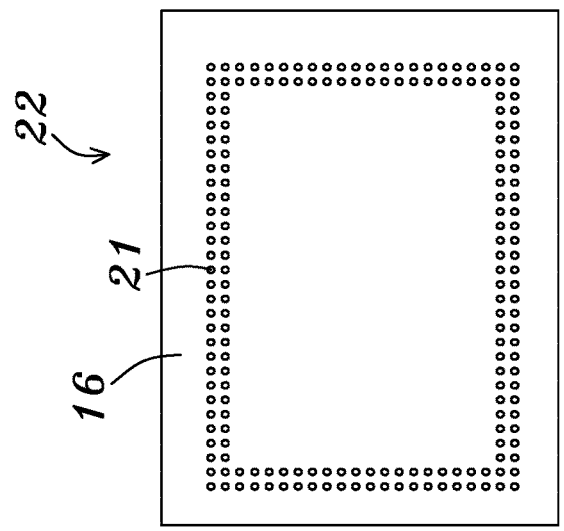

Next, referring to FIG. 16b-16d, the metal plugs 21 may be arranged different types, such as FIG. 16b, the metal plugs 21 are arranged on the side portions of the second substrate 22, or such as FIG. 16c, the metal plugs 21 are arranged on the side portions and center portion of the second substrate 22, or such as FIG. 16d, some portions of the second substrate 22 are not arranged the metal plugs 21.

Figure 17A:
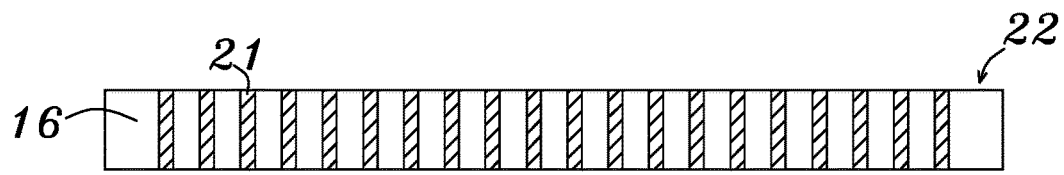
FIGS. 17a-17d illustrate cross-section views of the glass substrate and the metal plug, in accordance with the present disclosure.
Figure 17B:
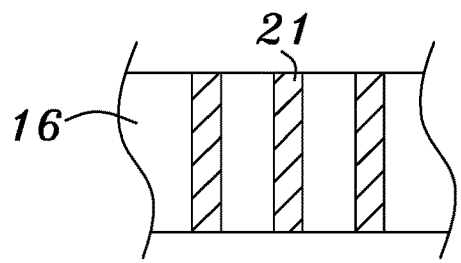
Figure 17C:
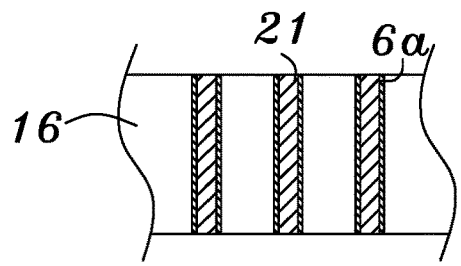
Figure 17D:
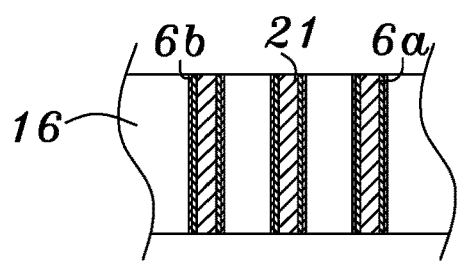

FIG. 17a illustrates a cross-section view of the second substrate 22 and FIG. 17b-FIG. 17d illustrates a cross-section view of the metal plug 21. The second substrate 22 comprise an amorphous solid glass layer/body 16 and multiple metal plugs 21, wherein the amorphous solid glass layer/body 16 having a top surface and an opposing bottom surface and the metal plugs 21 extending through the amorphous solid glass layer/body 16 beginning at the top surface and ending at the bottom surface. The top surface of the metal plugs 21 are the same as the bottom surface of the metal plugs 21.

Please referring FIG. 17b, the top surface of the metal plugs 21 and the top surface of the amorphous solid glass layer/body 16 are substantially coplanar. The bottom surface of the metal plugs 21 and the bottom surface of the amorphous solid glass layer/body 16 are substantially coplanar.

Please referring FIG. 17c, the top surface of the metal plugs 21 comprises a top surface of the metal traces 6 and a top surface of the first covering layer 6a are substantially coplanar with the top surface of the amorphous solid glass layer/body 16. the bottom surface of the metal plugs 21 comprises a bottom surface of the metal traces 6 and a bottom surface of the first covering layer 6a are substantially coplanar with the bottom surface of the amorphous solid glass layer/body 16.

Please referring FIG. 17d, the top surface of the metal plugs 21 comprises a top surface of the metal traces 6, a top surface of the first covering layer 6a and a top surface of the second covering layer 6b are substantially coplanar with the top surface of the amorphous solid glass layer/body 16. The bottom surface of the metal plugs 21 comprises a bottom surface of the metal traces 6, a bottom surface of the first covering layer 6a and a bottom surface of the second covering layer 6b are substantially coplanar with the bottom surface of the amorphous solid glass layer/body 16.

Figure 18A:
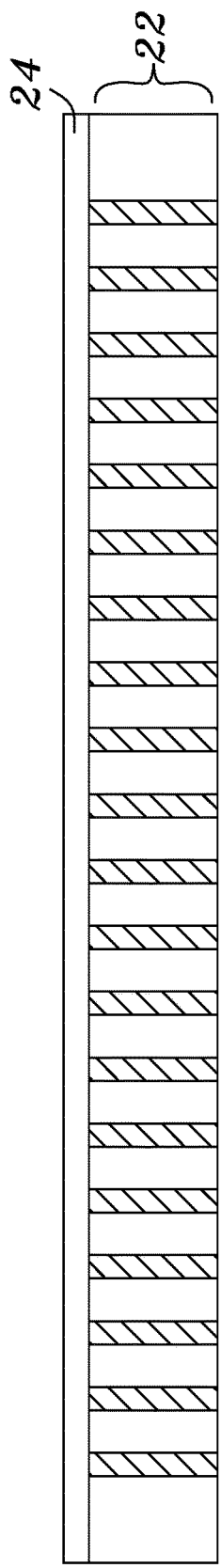
FIGS. 18a-18t illustrate a process to form multiple traces on a top surface and a bottom surface of the glass substrate, in accordance with the present disclosure.
Figure 18B:
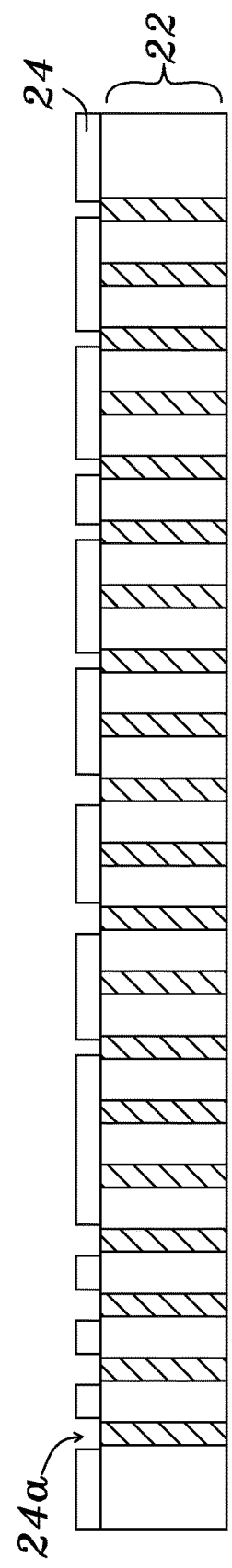
FIGS. 18u-18v illustrate cross-section views of multiple chips formed on the glass substrate, in accordance with the present disclosure.
FIG. 18w illustrates a cross-section view of the metal bump, in accordance with the present disclosure.
FIG. 18x illustrates a cross-section view of multiple chips formed on a top surface and bottom surface of the glass substrate, in accordance with the present disclosure.
FIG. 18y illustrates a cross-section view of multiple chips and a 3D-IC package formed on a top surface and bottom surface of the glass substrate, in accordance with the present disclosure.
FIG. 18z illustrates a top views of the multiple chips on the glass substrate, in accordance with the present disclosure.
Figure 18G:
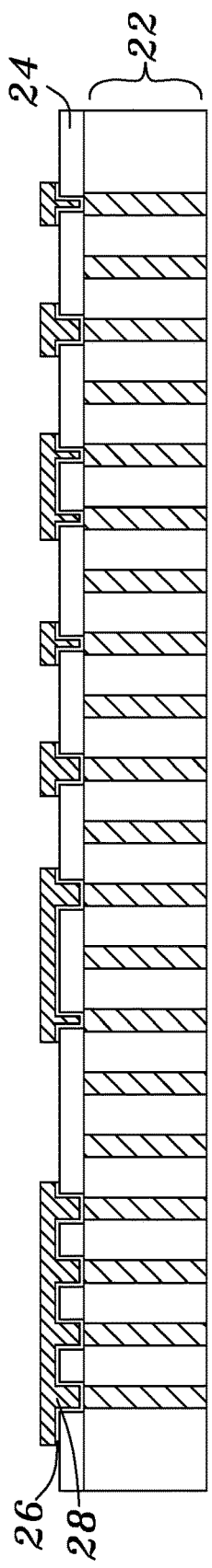
Figure 18H:
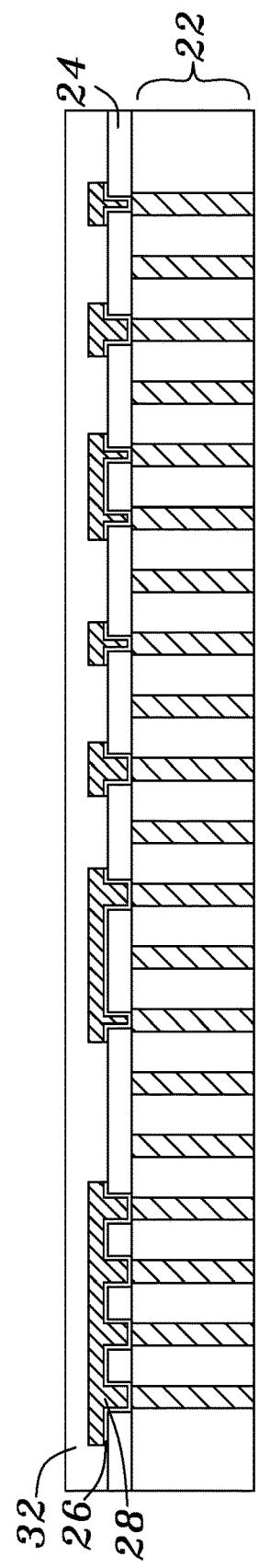
Figure 18I:
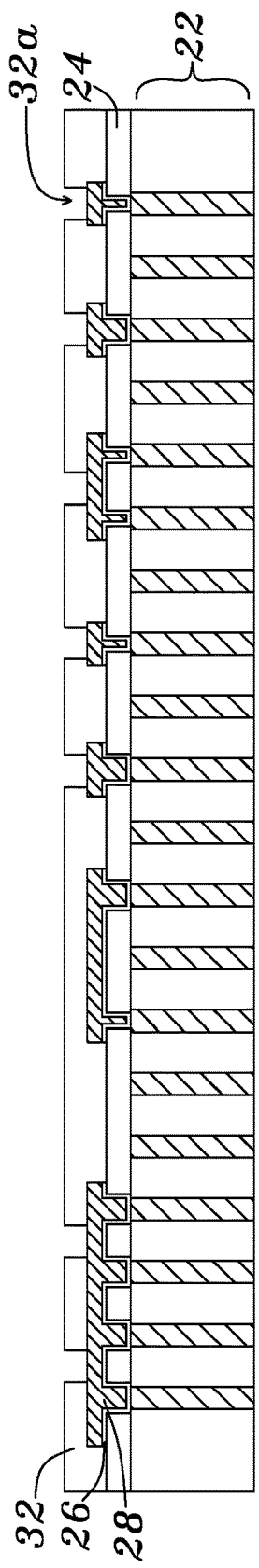
Figure 18J:
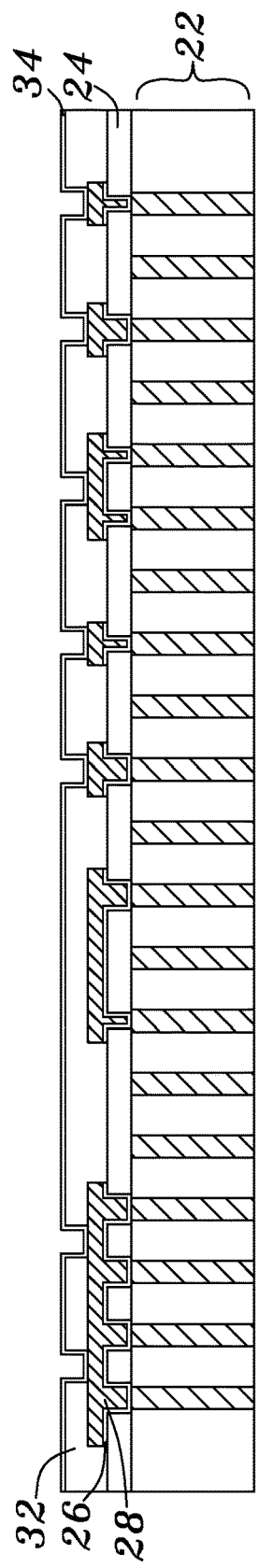
Figure 18O:
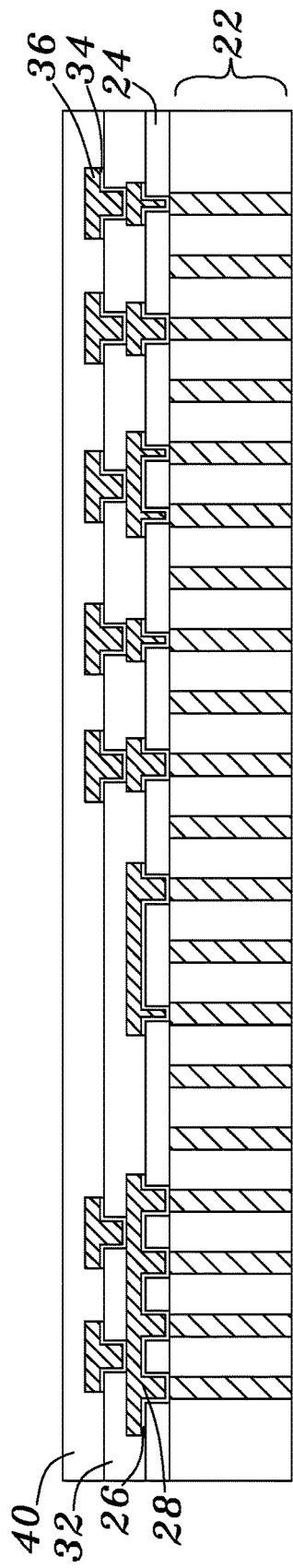
Figure 18P:
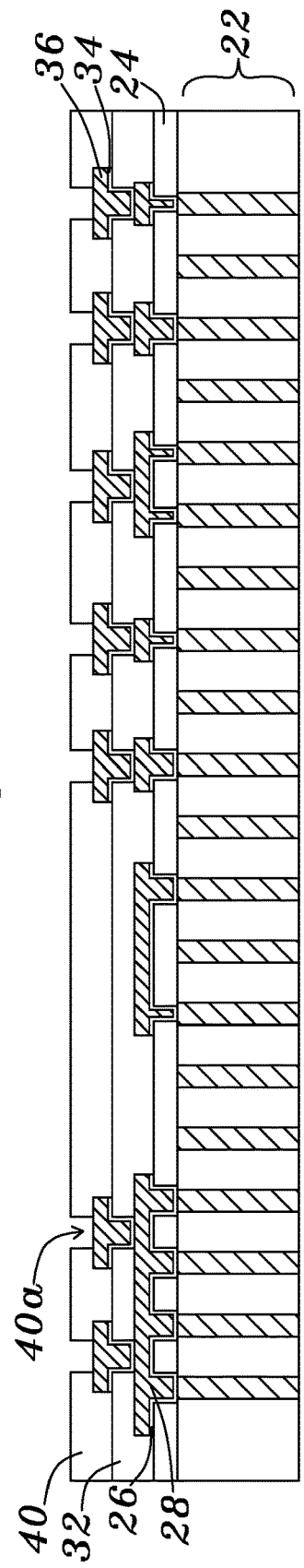
Figure 18Q:
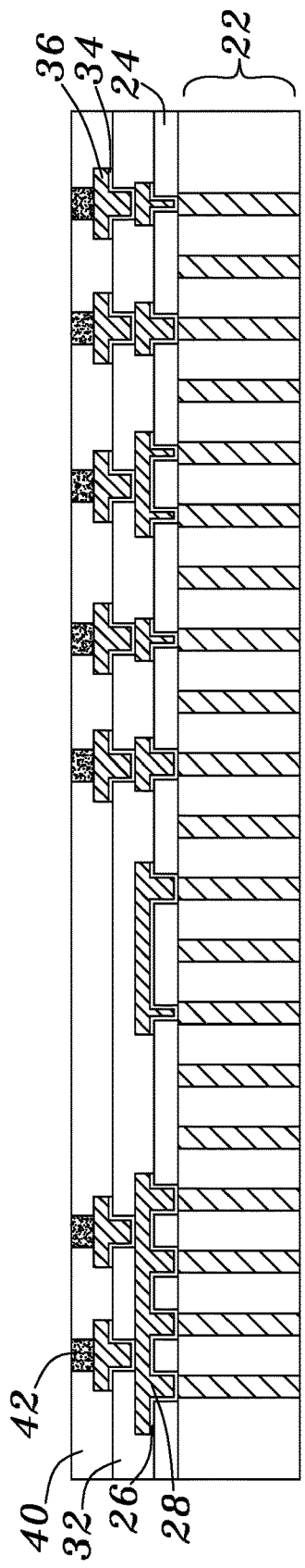
Figure 18S:
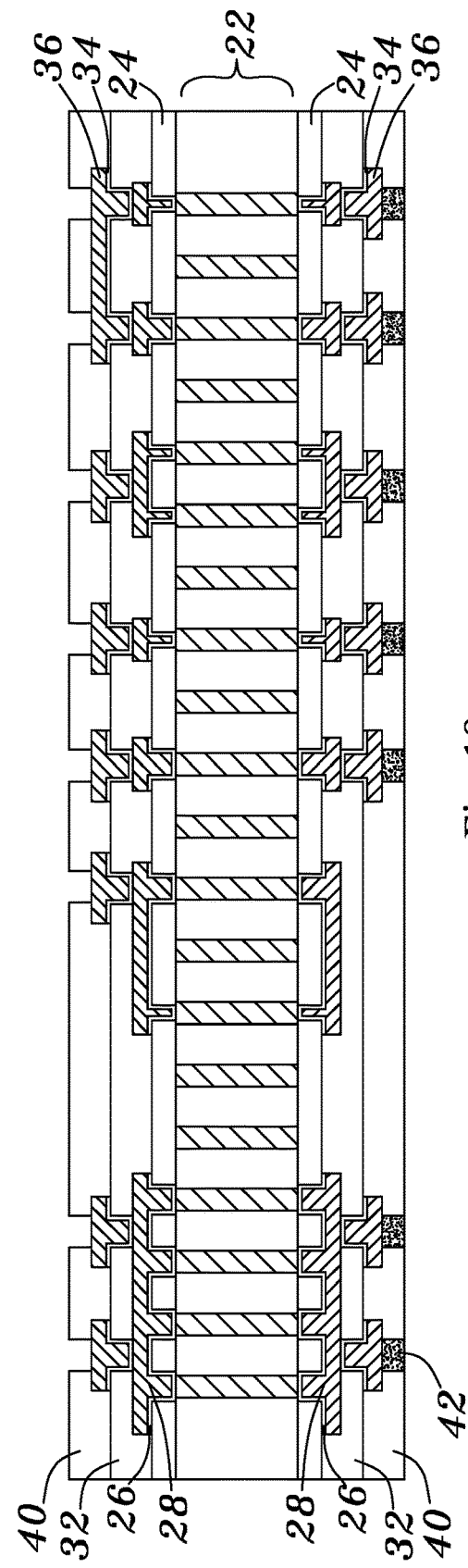
Figure 18T:
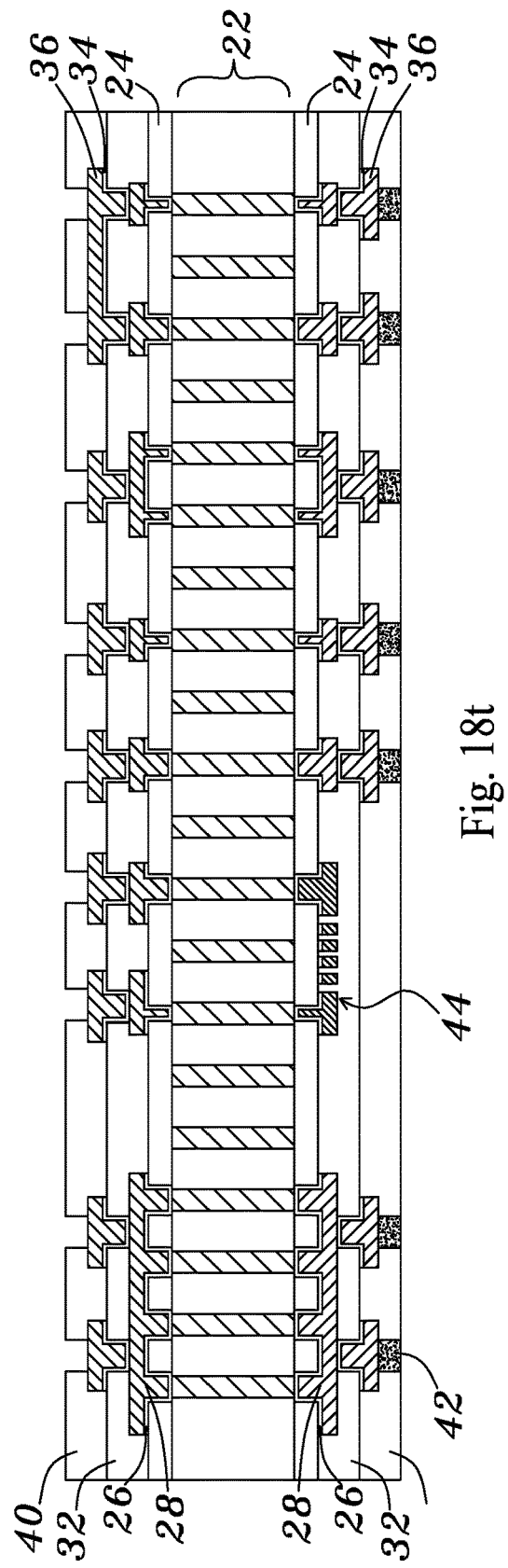

FIG. 18a-FIG. 18t illustrates a process to form multiple traces on a top surface and a bottom surface of the first substrate 20.

Next, referring to FIG. 18a, a dielectric layer 24 is formed on the top surface of the first substrate 20, wherein the dielectric layer 24 may include or may be a layer of silicon oxide (such as $SiO_2$), silicon nitride (such as $Si_3N_4$), silicon oxynitride (such as SiON), silicon oxycarbide (such as SiOC), phosphosilicate glass (PSG), silicon carbon nitride (such as SiCN), low k dielectric layer (K between 0.5 and 3), or polymer (such as polyimide, benzocyclobutene (BCB), polybenzoxazole (PBO), poly-phenylene oxide (PPO), epoxy, or silosane). The dielectric layer 24 may be formed or deposited using a suitable process. The dielectric layer 24 has a thickness between 0.3 and 5 micrometers, between 2 and 10 micrometers, between 1 and 30 micrometers or greater than 30 micrometers.

Next, referring to FIG. 18b, multiple openings 24a are formed in the dielectric layer 24 to expose the metal plugs 21. The openings 24a may be formed in the dielectric layer 24 by a suitable process, such as etching. The opening 24a has a width between 0.3 and 3 micrometers, between 0.5 and 8 micrometers, between 2 and 20 micrometers or between 2 and 50 micrometers.

Next, referring to FIG. 18c, a first metal layer 26 is formed on the dielectric layer 24, on the metal plugs 21 and in the openings 24a. The first metal layer 26 may include an adhesion/barrier layer, such as a layer of titanium, a titanium-tungsten alloy, titanium nitride, chromium, tantalum, tantalum nitride, nickel or nickel vanadium formed using a suitable process, such as vacuum deposition, Physical Vapor Deposition (PVD), Plasma Enhanced Chemical Vapor Deposition (PECVD), sputtering process or an electroplating process, with a thickness, e.g., between 1 nanometer and 2 micrometers, between 0.3 and 3 micrometers or between 0.5 and 10 micrometers.

Next, referring to FIG. 18d, a second metal layer 28 is formed on the first metal layer 26. The second metal layer 28 may be comprises copper, nickel, gold or aluminum formed using a suitable process, such as vacuum deposition, Physical Vapor Deposition (PVD), Plasma Enhanced Chemical Vapor Deposition (PECVD), sputtering process or an electroplating process, with a thickness, e.g., between 1 nanometer and 5 micrometers, between 1 and 5 micrometers or between 5 and 30 micrometers.

Next, referring to FIG. 18e, a photoresist layer 30 is formed on the second metal layer 28 by using a suitable process, such as spin coating process or lamination process.

Next, a photo exposure process using a 1× stepper and a development process using a chemical solution can be employed to form multiple openings 30a, exposing the second metal layer 28, in the photoresist layer. The photoresist layer 30 may have a thickness, e.g., between 3 and 50 micrometers, wherein the photoresist layer 30 may be a positive-type photo-sensitive resist layer or negative-type photo-sensitive resist layer.

Next, referring to FIG. 18f, remove the first metal layer 26 and the second metal layer 28 are under the openings 30a by using a suitable process, such as an etching process.

Next, referring to FIG. 18g, remove the photoresist layer 30 by using a clean process.

Next, referring to FIG. 18h, a dielectric layer 32 is formed on the first dielectric layer 24 and on the second metal layer 28, wherein the dielectric layer 32 may include or may be a layer of silicon oxide (such as $SiO_2$), silicon nitride (such as $Si_3N_4$), silicon oxynitride (such as SiON), silicon oxycarbide (such as SiOC), phosphosilicate glass (PSG), silicon carbon nitride (such as SiCN), low k dielectric layer (K between 0.5 and 3), or polymer (such as polyimide, benzocyclobutene (BCB), polybenzoxazole (PBO), poly-phenylene oxide (PPO), epoxy, or silosane). The dielectric layer 32 may be formed or deposited using a suitable process. The dielectric layer 32 has a thickness between 0.3 and 5 micrometers, between 2 and 10 micrometers, between 1 and 30 micrometers or greater than 30 micrometers.

Next, referring to FIG. 18i, multiple openings 32a are formed in the dielectric layer 32 to expose the second metal layer 28. The openings 32a may be formed in the dielectric layer 32 by a suitable process, such as etching. The opening 32a has a width between 0.3 and 3 micrometers, between 0.5 and 8 micrometers, between 2 and 20 micrometers or between 2 and 50 micrometers.

Next, referring to FIG. 18j, a third metal layer 34 is formed on the dielectric layer 32, on the second metal layer 28 and in the openings 32a. The third metal layer 34 may include an adhesion/barrier layer, such as a layer of titanium, a titanium-tungsten alloy, titanium nitride, chromium, tantalum, tantalum nitride, nickel or nickel vanadium formed using a suitable process, such as vacuum deposition, Physical Vapor Deposition (PVD), Plasma Enhanced Chemical Vapor Deposition (PECVD), sputtering process or an electroplating process, with a thickness, e.g., between 1 nanometer and 2 micrometers, between 0.3 and 3 micrometers or between 0.5 and 10 micrometers.

Next, referring to FIG. 18k, a fourth metal layer 36 is formed on the third metal layer 34. The fourth metal layer 36 may be comprises copper, nickel, gold or aluminum formed using a suitable process, such as vacuum deposition, Physical Vapor Deposition (PVD), Plasma Enhanced Chemical Vapor Deposition (PECVD), sputtering process or an electroplating process, with a thickness, e.g., between 1 nanometer and 5 micrometers, between 1 and 5 micrometers or between 5 and 30 micrometers.

Next, referring to FIG. 18l, a photoresist layer 38 is formed on the fourth metal layer 36 by using a suitable process, such as spin coating process or lamination process. Next, a photo exposure process using a 1× stepper and a development process using a chemical solution can be employed to form multiple openings 38a, exposing the fourth metal layer 36, in the photoresist layer. The photoresist layer 38 may have a thickness, e.g., between 3 and 50 micrometers, wherein the photoresist layer 38 may be a positive-type photo-sensitive resist layer or negative-type photo-sensitive resist layer.

Next, referring to FIG. 18m, remove the third metal layer 34 and the fourth metal layer 36 are under the openings 38a by using a suitable process, such as an etching process.

Next, referring to FIG. 18n, remove the photoresist layer 38 by using a clean process.

Next, referring to FIG. 18o, a dielectric layer 40 is formed on the second dielectric layer 32 and on the fourth metal layer 36, wherein the dielectric layer 40 may include or may be a layer of silicon oxide (such as $SiO_2$), silicon nitride (such as $Si_3N_4$), silicon oxynitride (such as SiON), silicon oxycarbide (such as SiOC), phosphosilicate glass (PSG), silicon carbon nitride (such as SiCN), low k dielectric layer (K between 0.5 and 3), or polymer (such as polyimide, benzocyclobutene (BCB), polybenzoxazole (PBO), polyphenylene oxide (PPO), epoxy, or silosane). The dielectric layer 40 may be formed or deposited using a suitable process. The dielectric layer 40 has a thickness between 0.3 and 5 micrometers, between 2 and 10 micrometers, between 1 and 30 micrometers or greater than 30 micrometers.

Next, referring to FIG. 18p, multiple openings 40a are formed in the dielectric layer 40 to expose the fourth metal layer 36. The openings 40a may be formed in the dielectric layer 40 by a suitable process, such as etching. The opening 40a has a width between 0.3 and 3 micrometers, between 0.5 and 8 micrometers, between 2 and 20 micrometers or between 2 and 50 micrometers.

Next, referring to FIG. 18q, a protecting layer 42 is formed in the openings 40a, on the dielectric layer 40 and on the fourth metal layer 36, which can protect the dielectric layer 40 not to be damaged and the fourth metal layer 36 not be damaged and oxidated.

Next, referring to FIG. 18s, repeat the processes of FIG. 18a-FIG. 18p to form the dielectric layer 24, the first metal layer 26, the second metal layer 28, the dielectric layer 32, the third metal layer 34, the fourth metal layer 36 and the dielectric layer 40 on the bottom surface of the first substrate 20.

Furthermore, referring to FIG. 18t, a passive device 44 may be formed in the first metal layer 28 and the second metal layer 36, such as an inductor, a capacitor or a resistor.

Figure 18U:
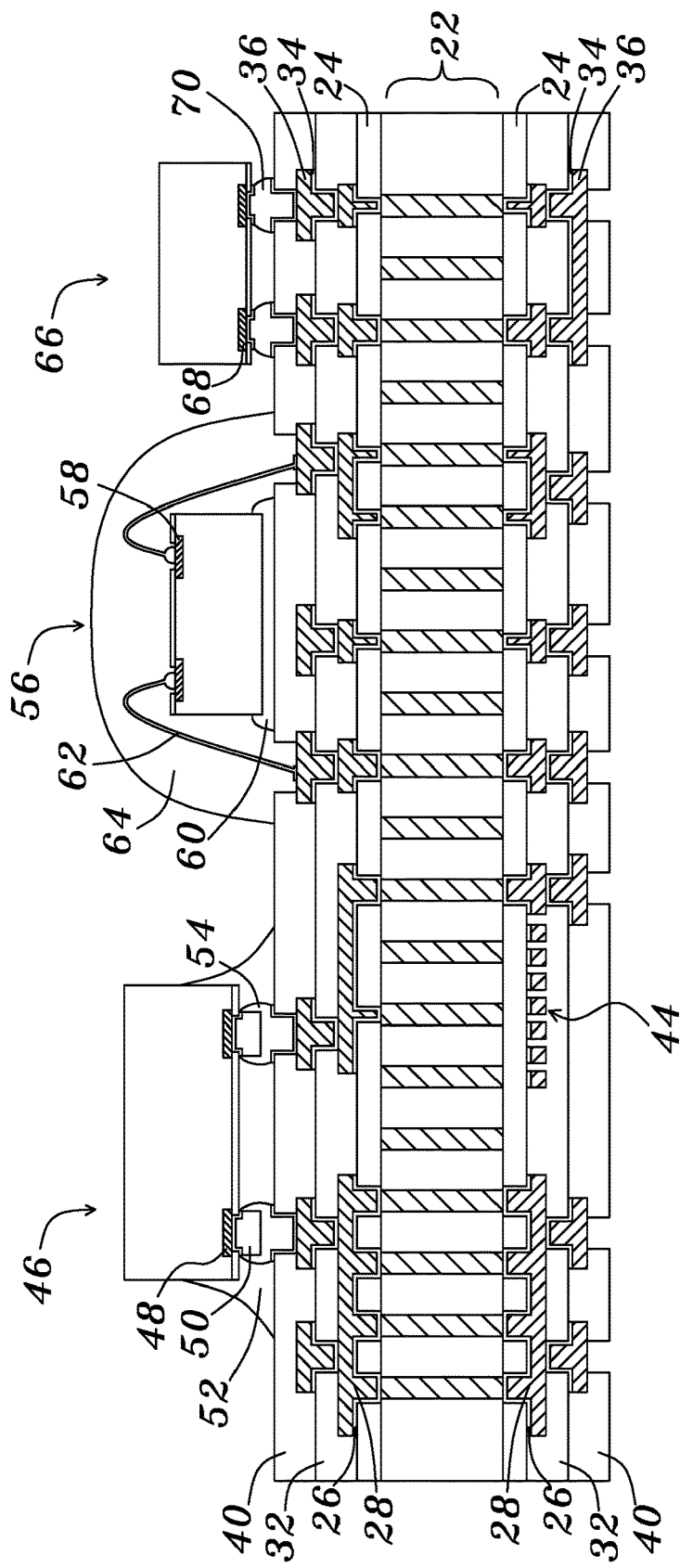

Next, referring to FIG. 18u, multiple chips 46 and chips 56 set up over the dielectric layer 40 through a flip chip package process or a wirebonding package process, wherein the chip 46 and 56 comprises may be a memory chip, such as NAND-Flash memory chip, Flash memory chip, DRAM chip, SRAM chip or SDRAM chip, a central-processing-unit (CPU) chip, a graphics-processing-unit (GPU) chip, a digital-signal-processing (DSP) chip, a baseband chip, a wireless local area network (WLAN) chip, a logic chip, an analog chip, a global-positioning-system (GPS) chip, a "Bluetooth" chip, or a chip including one or more of a CPU circuit block, a GPU circuit block, a DSP circuit block, a memory circuit block (such as DRAM circuit block, SRAM circuit block, SDRAM circuit block, Flash memory circuit block, or NAND-Flash memory circuit block), a baseband circuit block, a Bluetooth circuit block, a GPS circuit block, a MEMS chip, a COMS image sensor device, a WLAN circuit block, and a modem circuit block, from the semiconductor wafer.

The chips 46 are set up on the dielectric layer 40 through a flip chip package process, wherein the chip 46 comprises multiple metal pads 48 and multiple metal bumps 50 formed on the metal pads 48. The metal pad 48 may be an electroplated copper pad, a damascene copper pad or an aluminum pad. The metal bump 50 comprises an adhesion/barrier metal layer formed on the metal pad 48, an electroplated metal layer or an electro-less metal layer formed on the adhesion/barrier metal layer, wherein the adhesion/barrier metal layer comprises a titanium-containing layer, a chromium-containing layer, a tantalum-containing layer or a nickel layer, and the electroplated metal layer comprises a copper layer, a gold layer, a nickel layer, a tin-containing layer, a solder layer, a solder layer over a nickel layer and a copper layer, and the electro-less layer comprises a copper layer, a gold layer or a nickel layer. The electroplated metal layer has a thickness between 2 and 5 micrometers, between 5 and 30 micrometers or between 10 and 50 micrometers. The metal bumps 50 are connected to the fourth metal layer 36 exposed by the openings 40a through a solder layer 54, wherein the solder layer 54 is formed on the fourth metal layer 36 exposed by the openings 40a or is a portion of the metal bump 50. An underfill layer 52 is formed between the chips 46 and the dielectric layer 40.

The chips 56 are set up over the dielectric layer 40 through a polymer adhesion layer 60, wherein the chip 56 comprises multiple metal pads 58. The metal pad 58 may be an electroplated copper pad, a damascene copper pad or an aluminum pad. Multiple metal wires 62 are connected to the metal pads 58 and the fourth metal layer 36 exposed by the openings 40a, wherein the metal wires 62 comprises a gold wire, a copper wire, a metal alloy wire, a silver-containing wire, an aluminum-containing wire or gold-copper alloy wire. An underfill layer 64 is covered the chip 45, metal wires 62 and the metal pads 58.

Multiple discrete passive components 66 set up on the dielectric layer 40, such as a discrete inductor, a discrete capacitor or a discrete resistor, wherein the discrete passive component 66 comprises a multiple metal pad 68. The discrete passive components 66 mounted on the dielectric layer 40 through a solder layer 70.

Figure 18V:
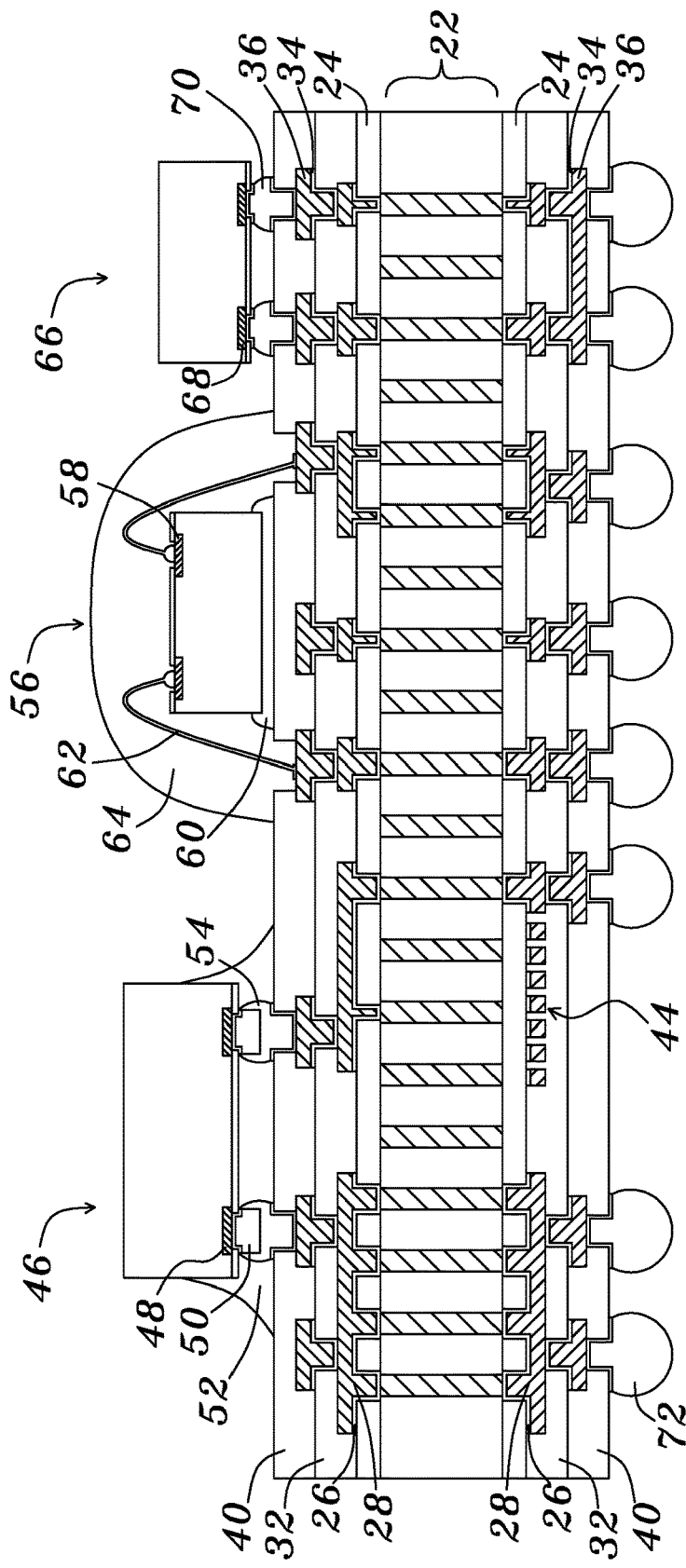

Next, referring to FIG. 18v, multiple metal bumps 72 are formed on the bottom surface of the substrate 20.

FIG. 18w is disclosed some structures of metal bump 72.

Lift side: $1^{st}$ type of structures of metal bump 72 comprises an adhesion/barrier metal layer 61 formed on the metal pad 48, a metal seed layer 63 formed on the adhesion/barrier metal layer 61, an electroplated metal layer 65 formed on the metal seed layer 63 and a solder layer 67 formed on the electroplated metal layer 65, wherein the adhesion/barrier metal layer 61 comprises a titanium-containing layer, a chromium-containing layer, a tantalum-containing layer or a nickel layer, wherein the electroplated metal layer 65 comprises a copper layer, a gold layer, a nickel layer, wherein the solder layer 67 can be formed by screen plating, ball mounting, or an electroplating process, such as gold-tin alloy, tin-silver alloy, tin-silver-copper alloy, indium, tin-bismuth alloy, or other lead-free alloy. Lead alloy solders can also be used but may be less desirable in some embodiments due to toxicity considerations. The adhesion/barrier metal layer 61 has a thickness between 0.05 and 2 micrometers. The metal seed layer 63 has a thickness between 0.05 and 2 micrometers. The electroplated metal layer 65 has a thickness between 1 and 5 micrometers, between 2 and 8 micrometers or between 5 and 20 micrometers. The solder layer 67 has a thickness between 30 and 80 micrometers, between 50 and 100 micrometers, between 80 and 150 micrometers or between 120 and 350 micrometers.

Right side: $2^{nd}$ type of structure of metal bump 72 comprises an adhesion/barrier metal layer 61 formed on the metal pad 48, a metal seed layer 63 formed on the adhesion/barrier metal layer 61, a first electroplated metal layer 65 formed on the metal seed layer 63 and a second electroplated metal layer 69 formed on the first electroplated metal layer 65, wherein the adhesion/barrier metal layer 61 comprises a titanium-containing layer, a chromium-containing layer, a tantalum-containing layer or a nickel layer, wherein the first electroplated metal layer 65 comprises a copper layer, a gold layer, a nickel layer, wherein the second electroplated metal layer 69 comprises a copper layer, a gold layer, a nickel layer. The adhesion/barrier metal layer 61 has a thickness between 0.05 and 2 micrometers. The metal seed layer 63 has a thickness between 0.05 and 2 micrometers. The first electroplated metal layer 65 has a thickness between 1 and 5 micrometers, between 2 and 4 micrometers, between 5 and 15 micrometers or between 10 and 25 micrometers. The second electroplated metal layer 69 has a thickness between 1 and 5 micrometers, between 2 and 4 micrometers, between 10 and 30 micrometers or between 20 and 60 micrometers.

Figure 18X:
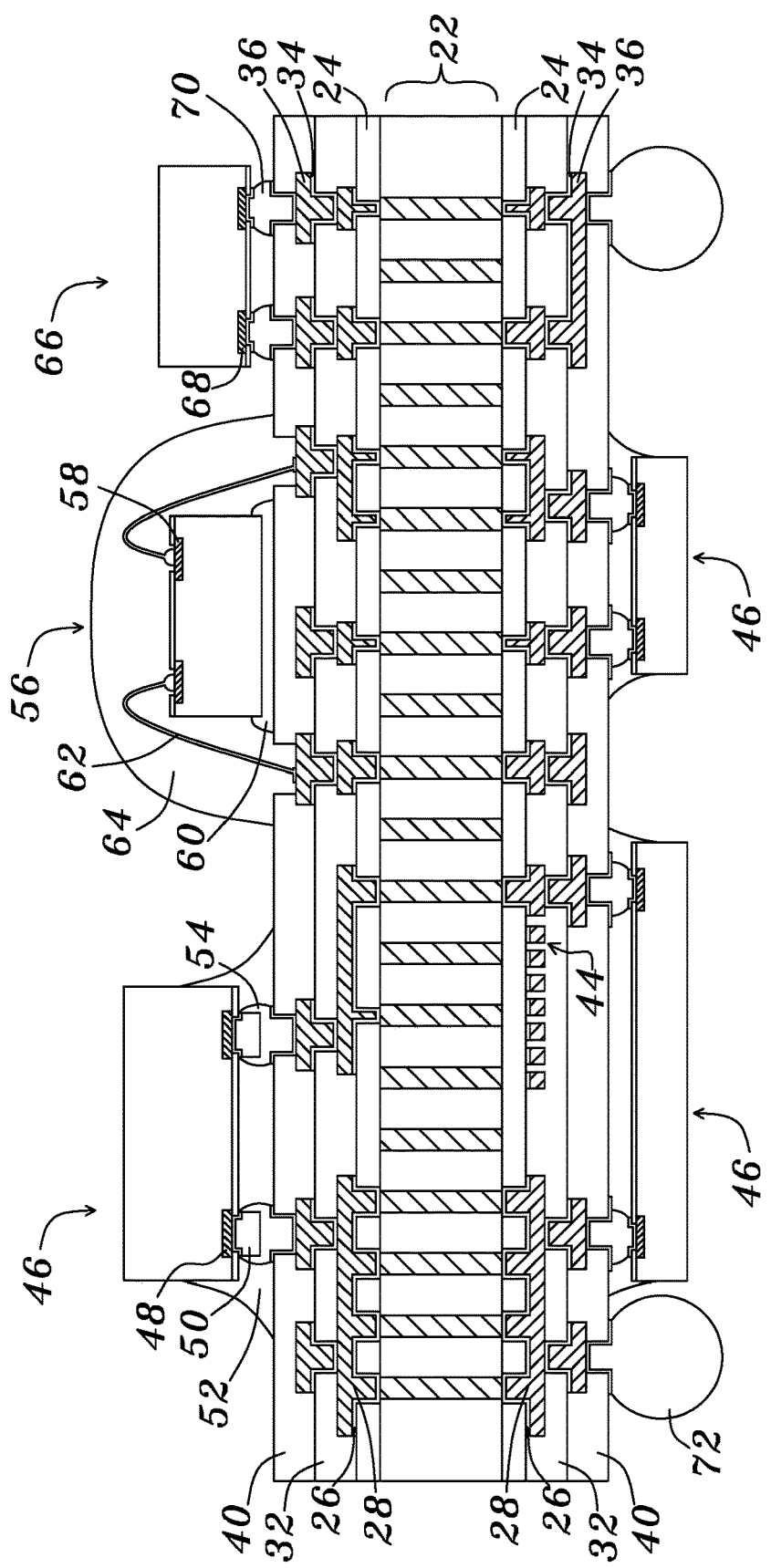

Furthermore, referring to FIG. 18x, the chips 46 may be set up on the bottom surface of the substrate 20.

Figure 18Y:
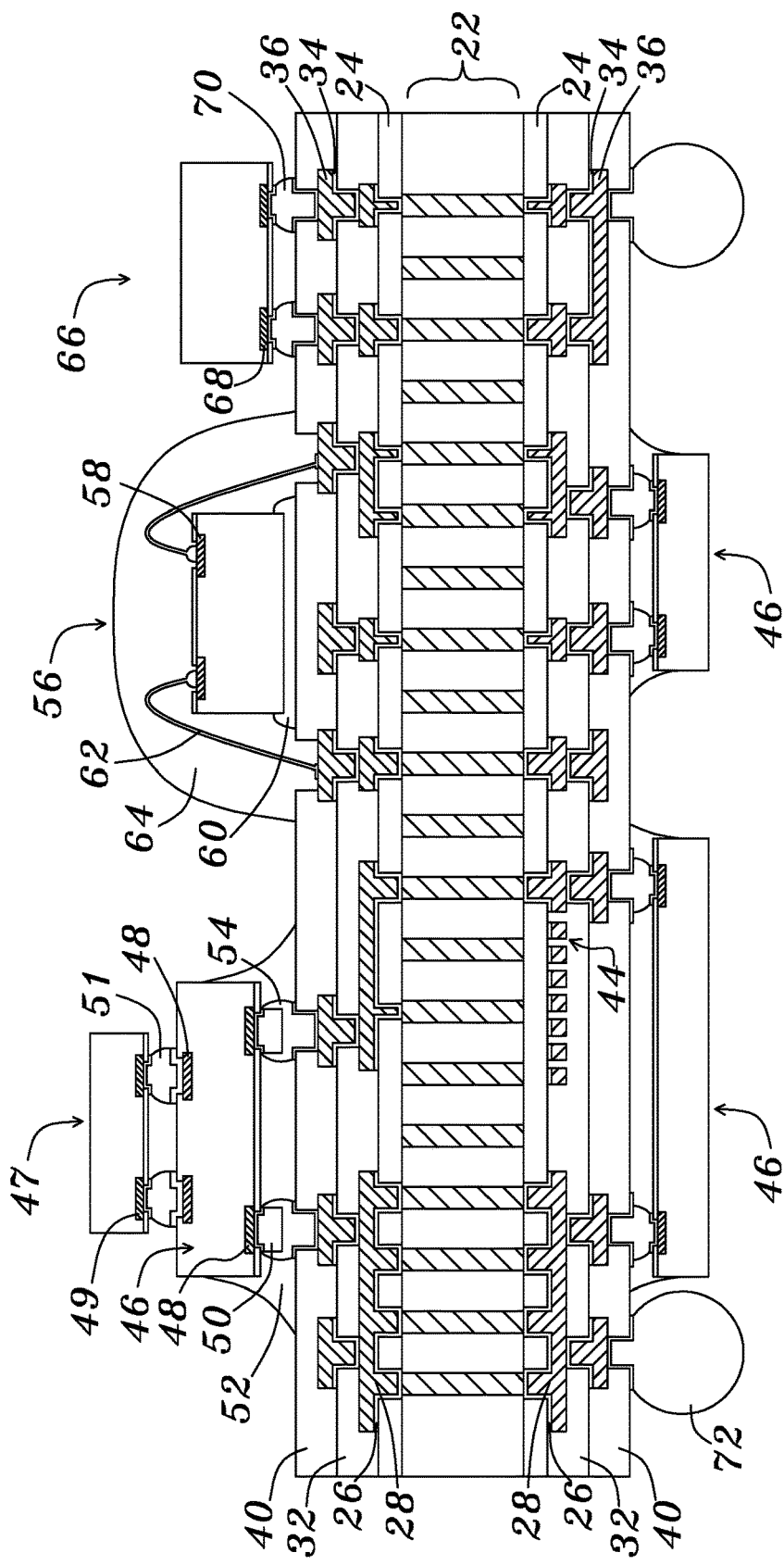

Furthermore, referring to FIG. 18y, the chip 46 may be a 3D IC chip, wherein the chip 46 comprises a multiple metal pad 48 formed on the top and bottom surface. The metal pads 48 of the top surface of the chip 46 are connected to the metal pads 48 of the bottom surface of the chip 46 through multiple through-silicon-via metal layers. A chip 47 is connected to the 3D IC chip 46 through the flip chip package process, wherein the chip 47 comprises multiple metal pads 49, wherein the metal pad 49 may be an electroplated copper pad, a damascene copper pad or an aluminum pad. The metal pads 49 are connected to the metal pads 48 through a solder layer 51.

Figure 18Z:
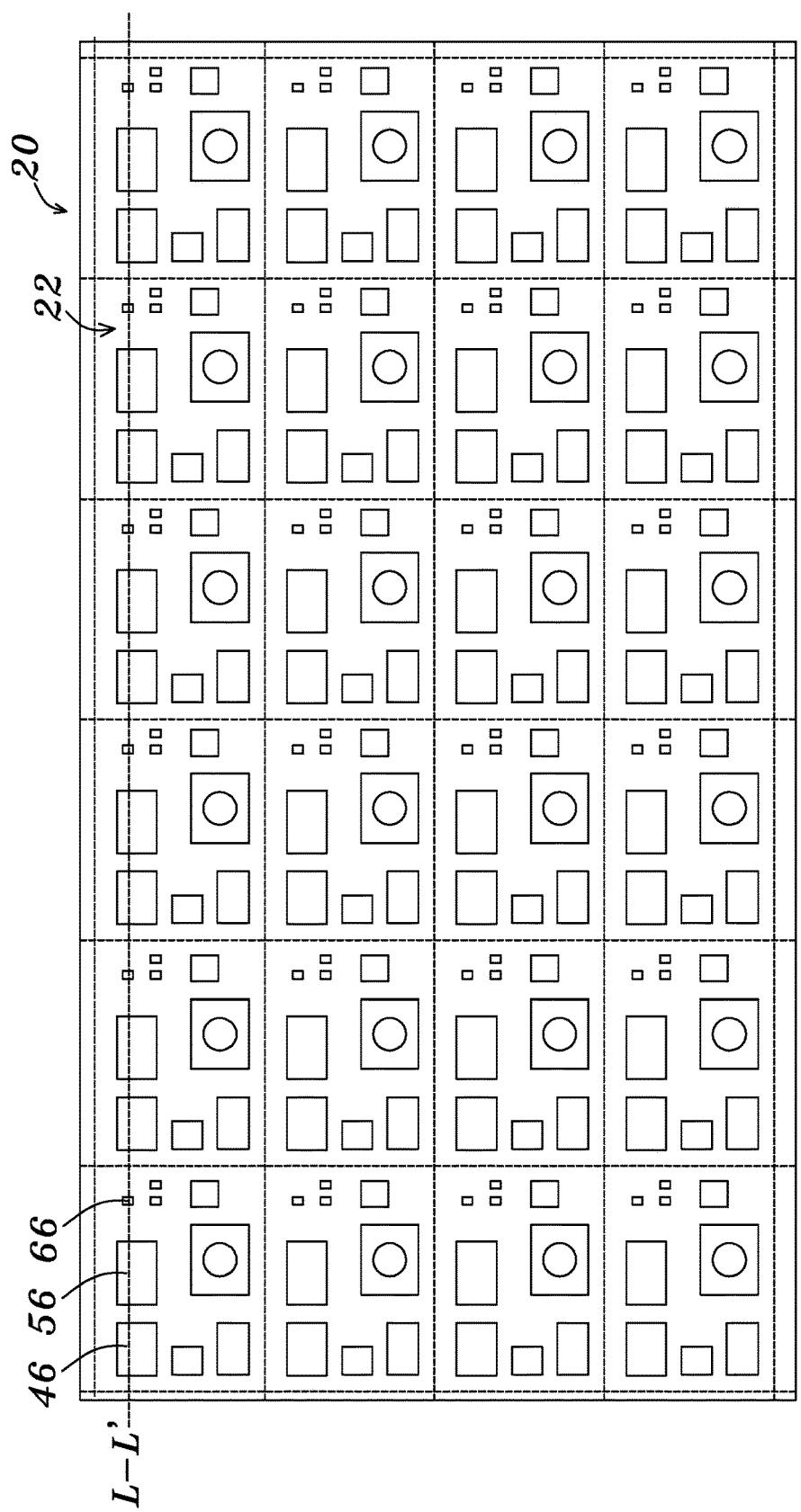

FIG. 18y, illustrates a top view of the substrate 20. FIG. 18v-FIG. 18x illustrate a cross section view of Line L-L' in FIG. 18z. Multiple the chips 46, the chips 56 and the passive components 66 may also be provided in or on the substrate 20.

Next, cutting the first substrate 20 to produce multiple second substrates 22.

FIG. 19a-FIG. 19j illustrates a damascene process to form the first metal layer 26, the second metal layer 28, the third metal layer 34 and the fourth metal layer 36 on a top surface and a bottom surface of the first substrate 20.

Figure 19A:
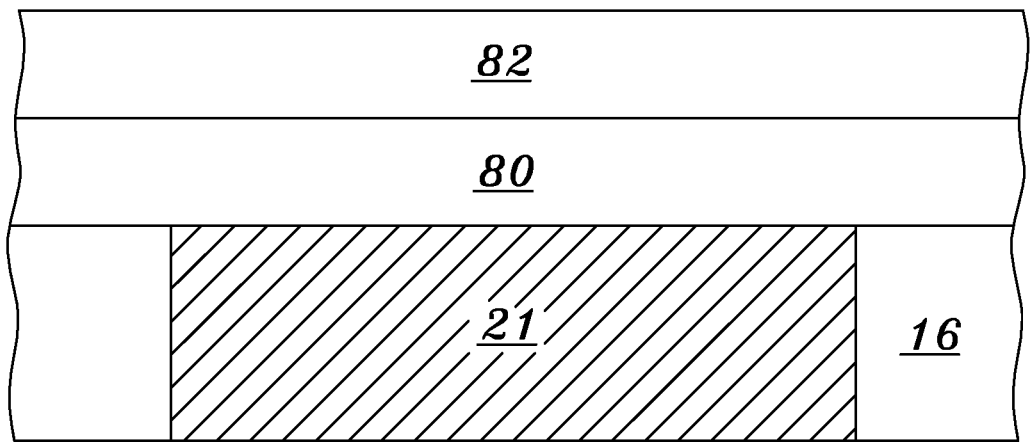
FIGS. 19a-19j illustrates a damascene process to form the metal layer on the glass substrate, in accordance with the present disclosure.
Figure 19B:
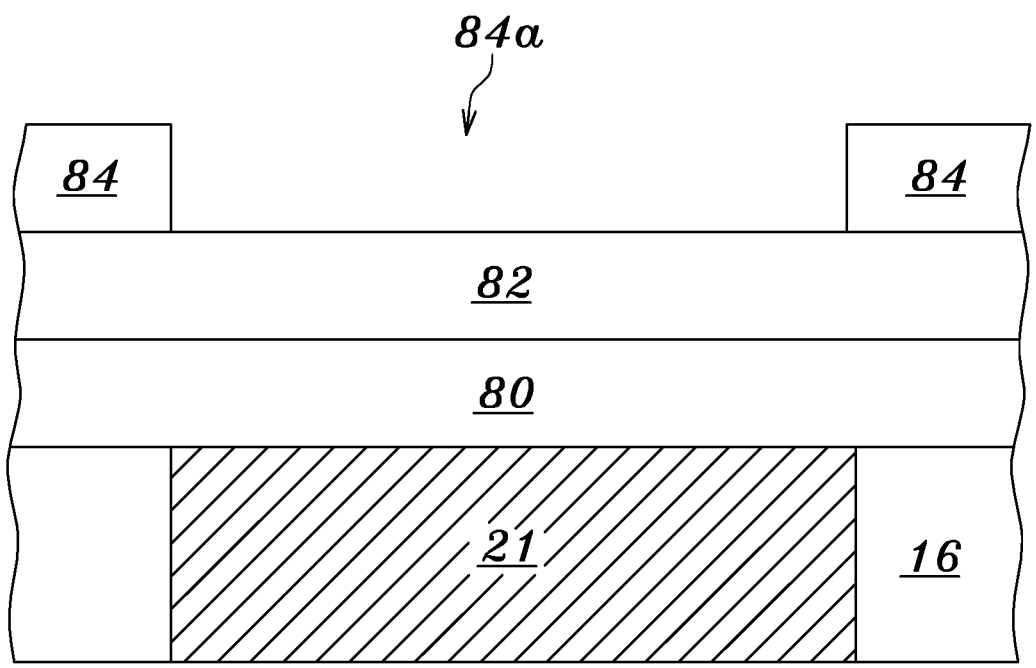
Figure 19C:
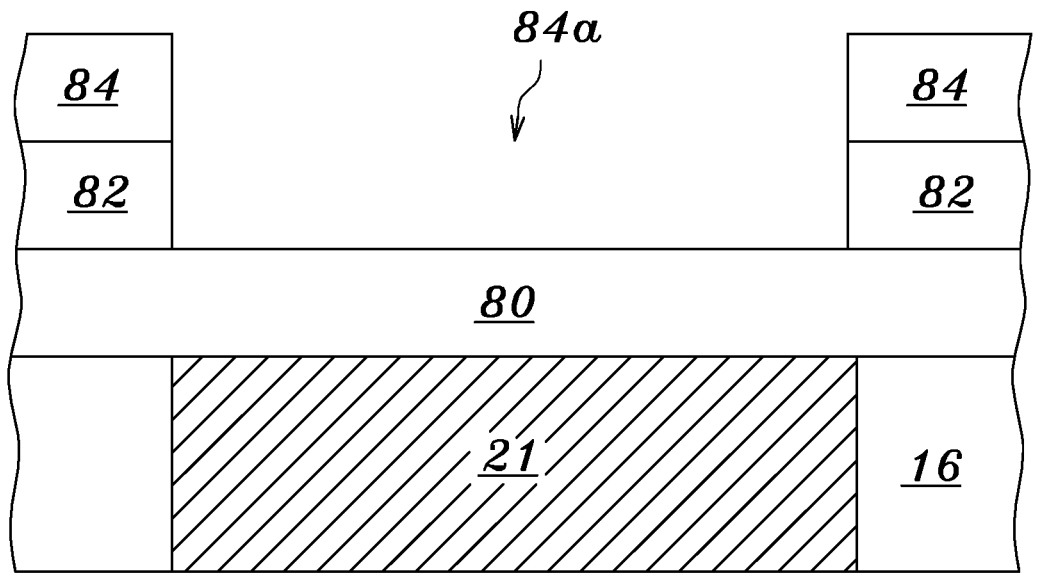
Figure 19D:
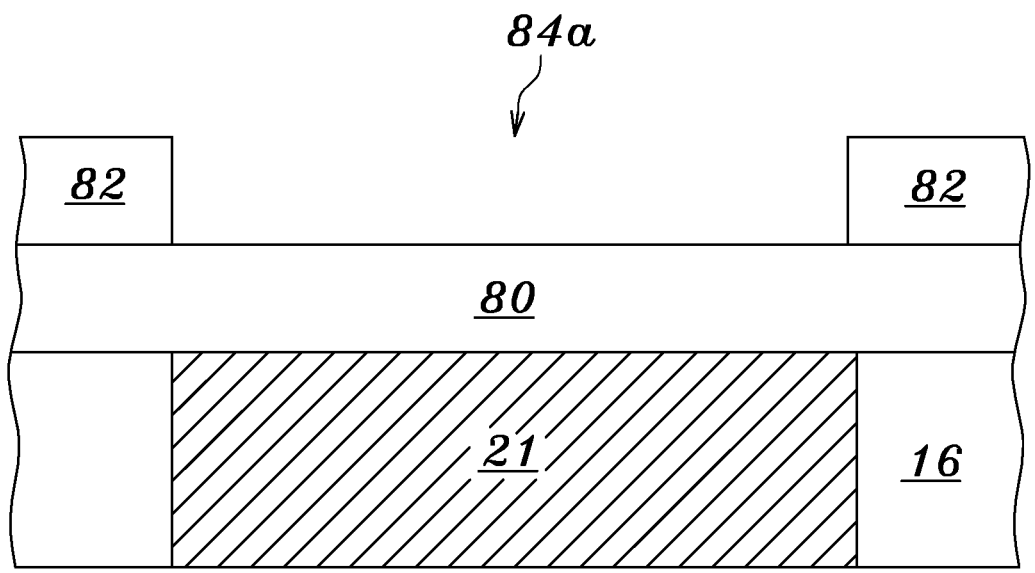
Figure 19E:
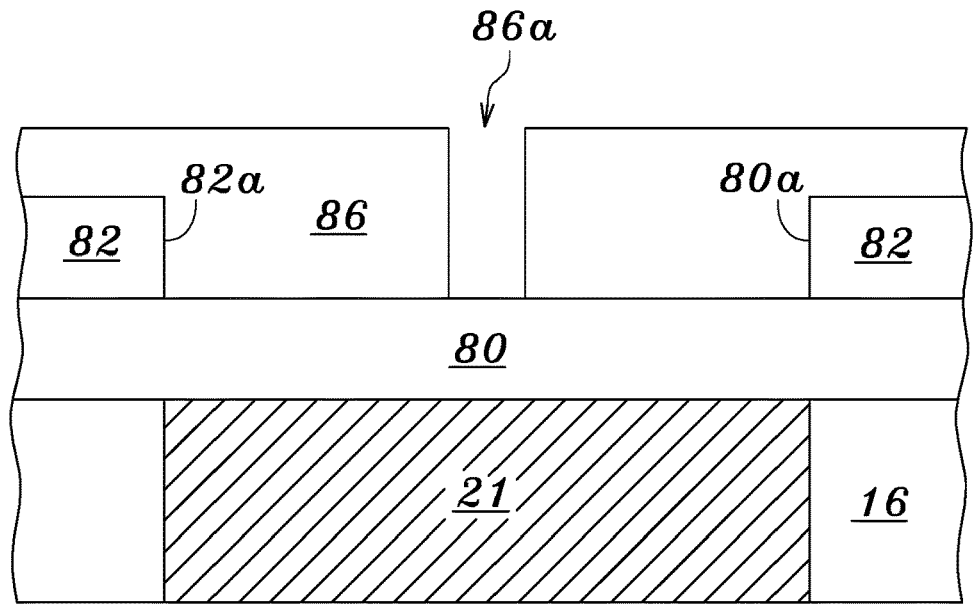
Figure 19F:
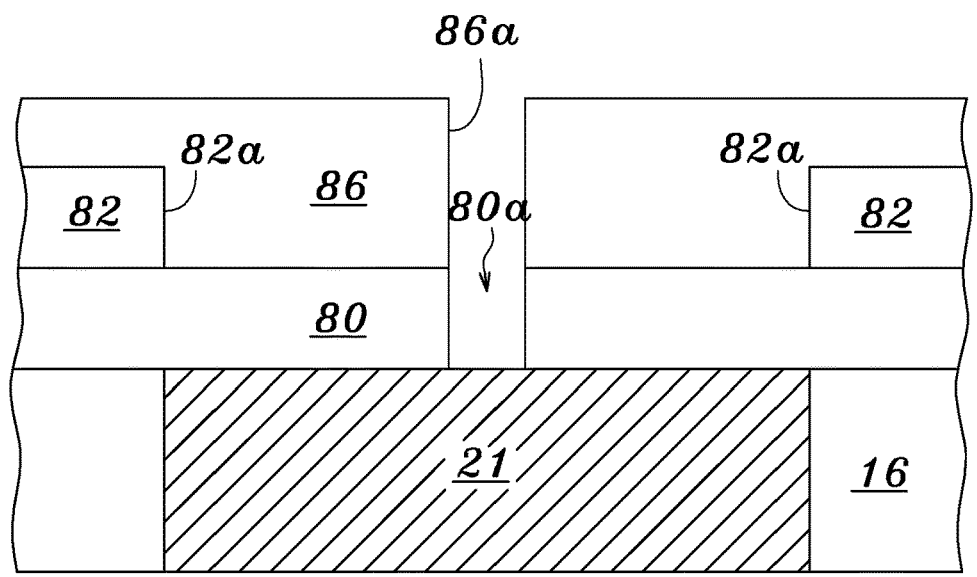
Figure 19G:
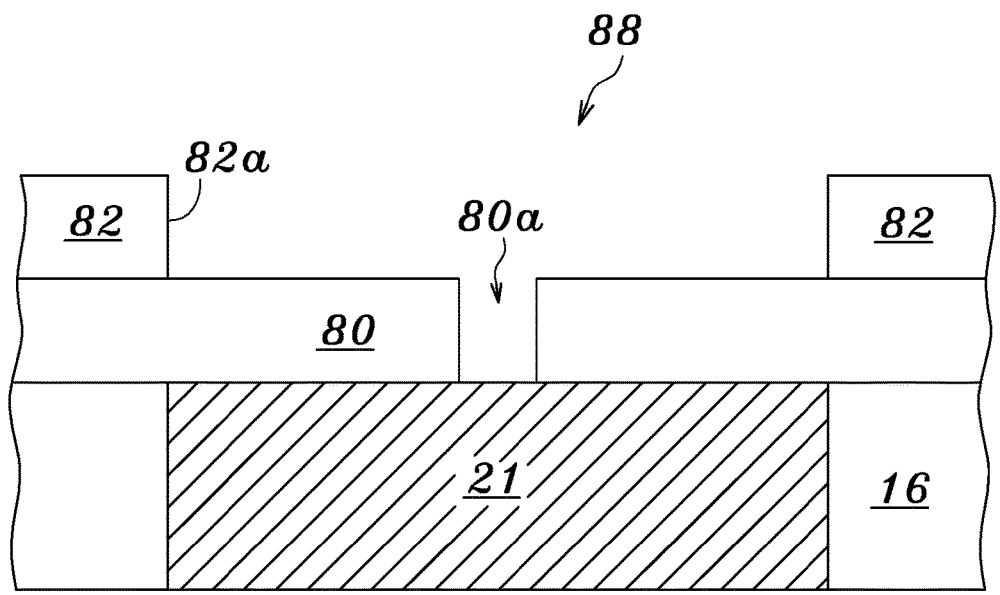
Figure 19H:
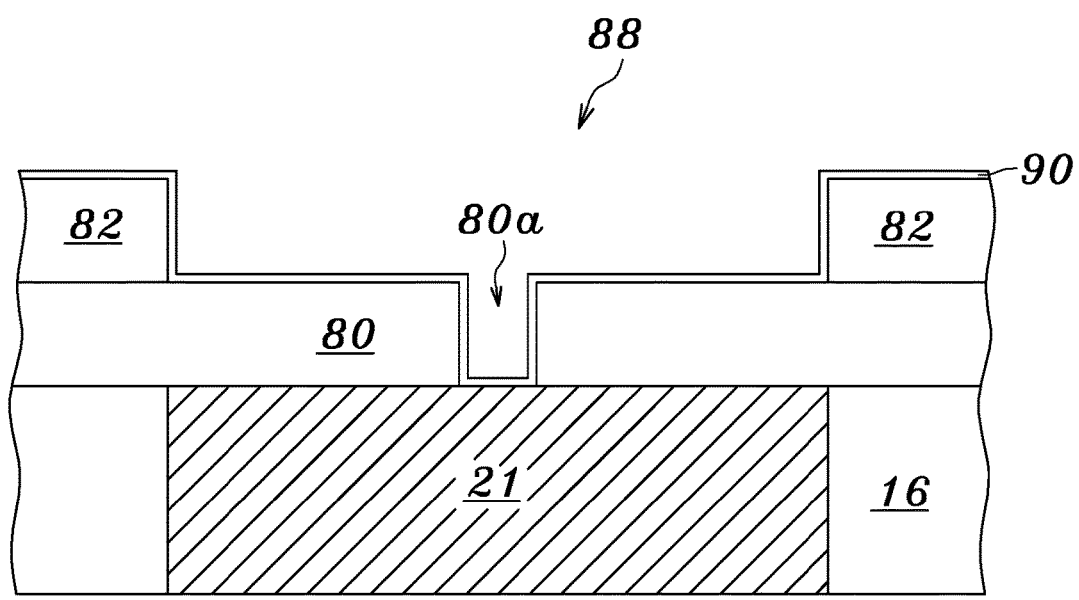
Figure 19I:
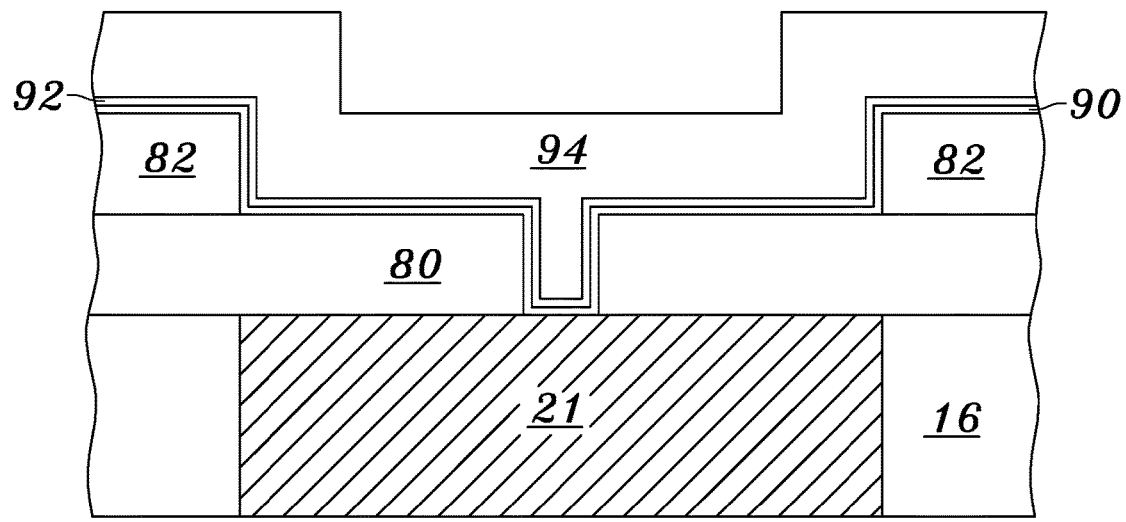
Figure 19J:
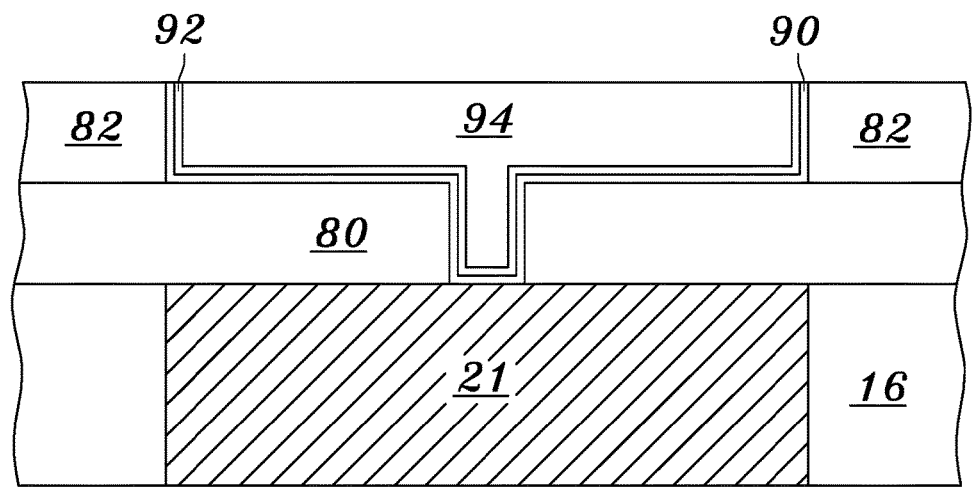

Referring to FIG. 19a, the dielectric layers 24 in FIG. 18A include two dielectric layers 80 and 82. The dielectric layer 80 is formed on the dielectric layer 82 by a chemical vapor deposition (CVD) process or a spin-on coating process, wherein each of the dielectric layers 80 and 82 may be composed of a low-K oxide layer with a thickness of between 0.3 and 5 μm, and preferably of between 0.5 and 3 μm, and an oxynitride layer on the low-K oxide layer, of a low-K polymer layer with a thickness of between 0.3 and 5 μm, and preferably of between 0.5 and 3 μm, and an oxynitride layer on the low-K polymer layer, of a low-K oxide layer with a thickness of between 0.3 and 5 μm, and preferably of between 0.5 and 3 μm, and a nitride layer on the low-K oxide layer, of a low-K polymer layer with a thickness of between 0.3 and 5 μm, and preferably of between 0.5 and 3 μm, and a nitride layer on the low-K polymer layer, or of a low-K dielectric layer with a thickness of between 0.3 and 5 μm, and preferably of between 0.5 and 3 μm, and a nitride-containing layer on the low-K dielectric layer. Next, referring to FIG. 19b, a photoresist layer 84 is formed on the dielectric layer 82, an opening 84a in the photoresist layer 84 exposing the dielectric layer 82. Next, referring to FIG. 19c, the dielectric layer 82 under the opening 84a is removed by a dry etching method to form a trench in the dielectric layer 82 exposing the dielectric layer 80. Next, referring to FIG. 19d, after forming the trench in the dielectric layer 82, the photoresist layer 84 is removed. Next, referring to FIG. 19e, a photoresist layer 86 is formed on the dielectric layer 82 and on the dielectric layer 80 exposed by the trench, an opening 86a in the photoresist layer 86 exposing the dielectric layer 80 exposed by the trench. Next, referring to FIG. 19f, the dielectric layer 80 under the opening 86a is removed by a dry etching method to form a via 80a in the dielectric layer 80 exposing the metal plugs 21 in the substrate 20. Next, referring to FIG. 19g, after forming the via 80a in the dielectric layer 80, the photoresist layer 86 is removed. Thereby, an opening 88 including the trench and the via 80a is formed in the dielectric layers 82 and 80. Next, referring to FIG. 19h, an adhesion/barrier layer 90 having a thickness of between 0.1 and 3 micrometers is formed on the metal plugs 21 exposed by the opening 88, on the sidewalls of the opening 88 and on the top surface of the dielectric layer 82. The adhesion/barrier layer 90 can be formed by a sputtering process or a chemical vapor deposition (CVD) process. The material of the adhesion/barrier layer 90 may include titanium, titanium nitride, a titanium-tungsten alloy, tantalum, tantalum nitride, or a composite of the abovementioned materials. For example, the adhesion/barrier layer 90 may be formed by sputtering a tantalum layer on the metallization structure exposed by the opening 88, on the sidewalls of the opening 88 and on the top surface of the dielectric layer 82. Alternatively, the adhesion/barrier layer 90 may be formed by sputtering a tantalum-nitride layer on the metallization structure exposed by the opening 88, on the sidewalls of the opening 88 and on the top surface of the dielectric layer 82. Alternatively, the adhesion/barrier layer 90 may be formed by forming a tantalum-nitride layer on the metallization structure exposed by the opening 88, on the sidewalls of the opening 88 and on the top surface of the dielectric layer 82 by a chemical vapor deposition (CVD) process. Next, referring to FIG. 19i, a seed layer 92, made of copper, having a thickness of between 0.1 and 3 micrometers is formed on the adhesion/barrier layer 90 using a sputtering process or a chemical vapor deposition (CVD) process, and then a copper layer 94 having a thickness of between 0.5 and 5 µm, and preferably of between 1 and 2 µm, is electroplated on the seed layer 92. Next, referring to FIG. 19j, the copper layer 94, the seed layer 92 and the adhesion/barrier layer 90 outside the opening 88 in the dielectric layers 82 and 80 are removed using a chemical mechanical polishing (CMP) process until the top surface of the dielectric layer 82 is exposed to an ambient.

FIG. 20a-FIG. 20i illustrates an embossing process to form the first metal layer 26, the second metal layer 28, the third metal layer 34 and the fourth metal layer 36 on a top surface and a bottom surface of the first substrate 20.

Figure 20A:
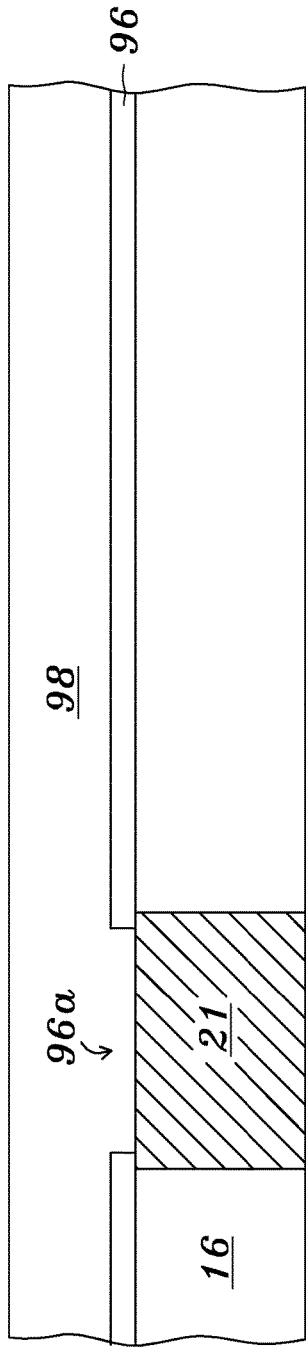

Referring to FIG. 20a, the metal plugs 21 are in the glass layer 16 of the first substrate 20, and the opening 96a in the dielectric layer 96 exposes the metal trace 6.

Figure 20B:
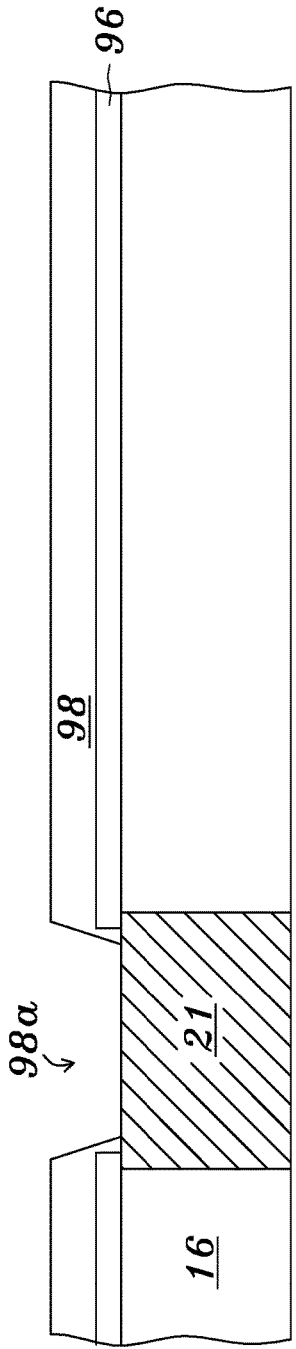
Figure 20C:
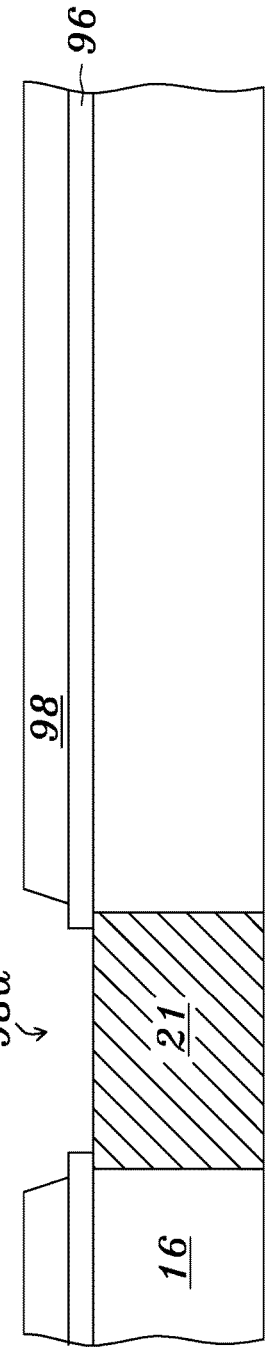

Referring to FIG. 20a, a polymer layer 98 can be formed on the dielectric layer 96, and at least one opening 98a is formed in the polymer layer 98 by patterning the polymer layer 98 to expose at least one metal trace 6, as shown in FIG. 20b and FIG. 20c. The metal plugs 21 may include a center portion exposed by an opening 98a and a peripheral portion covered with the polymer layer 98, as shown in FIG. 20b. Alternatively, the opening 98a may expose the entire upper surface of the metal plugs 21 exposed by the opening 96a in the dielectric layer 96 and further may expose the upper surface of the dielectric layer 96 near the metal trace 6, as shown in FIG. 20c.

The material of the polymer layer 98 may include benzocyclobutane (BCB), polyimide (PI), polyurethane, epoxy resin, a parylene-based polymer, a solder-mask material, an elastomer, or a porous dielectric material. The polymer layer 98 has a thickness of between 3 and 25 µm or between 5 and 50 micrometers.

The polymer layer 98 can be formed by a spin-on coating process, a lamination process or a screen-printing process. Below, the process of forming a patterned polymer layer 98 is exemplified with the case of spin-on coating a polyimide layer on the dielectric layer 96 and then patterning the polyimide layer. Alternatively, the polymer layer 98 can be formed by spin-on coating a layer of benzocyclobutane, polyurethane, epoxy resin, a parylene-based polymer, a solder-mask material, an elastomer or a porous dielectric material on the dielectric layer 96, and then patterning the layer.

Referring to FIG. 20d, an adhesion/barrier layer 100 having a thickness of between 0.1 and 3 micrometers, and preferably between 0.5 and 2 micrometers, is formed on the polymer layer 98 and on the metal trace 6. The adhesion/barrier layer 100 may be a titanium-tungsten-alloy layer, tantalum-containing layer, a chromium-containing layer or a titanium-nitride layer. The adhesion/barrier layer 100 may be formed by a sputtering method, an evaporation method, or a chemical vapor deposition (CVD) method.

Referring to FIG. 20e, a photoresist layer 102 can be formed on the adhesion/barrier layer 100 by a spin coating process or a lamination process. Referring to FIG. 20f, the photoresist layer 102 is patterned with the processes of exposure, development, etc., to form a photoresist opening 102a on the above-mentioned adhesion/barrier layer 100 over the metal plugs 21 exposed by the opening 98a.

Referring to FIG. 20f, the photoresist layer 102 is patterned with the processes of exposure, development, etc., to form a photoresist opening 102a on the adhesion/barrier layer 100 over the metal plugs 21 exposed by the opening 98a.

Referring to FIG. 20g, an electroplated metal layer 104 is formed on the adhesion/barrier layer 100 in the opening 102a, wherein the electroplated metal layer 104 comprises a copper layer, gold layer, a nickel layer, has a thickness between 2 and 10 micrometers, between 5 and 20 micrometers or between 5 and 35 micrometers.

Referring to FIG. 20h, removing the photoresist layer 102.

Referring to FIG. 20i, the above-mentioned adhesion/barrier layer 100 not under the electroplated metal layer 104 is removed with a dry etching method or a wet etching method. For example, the adhesion/barrier layer 100 made of titanium, titanium-tungsten alloy, titanium nitride, tantalum or tantalum nitride, not under the electroplated metal layer 104 is removed with a reactive ion etching (RIE) process.

Figure 21:
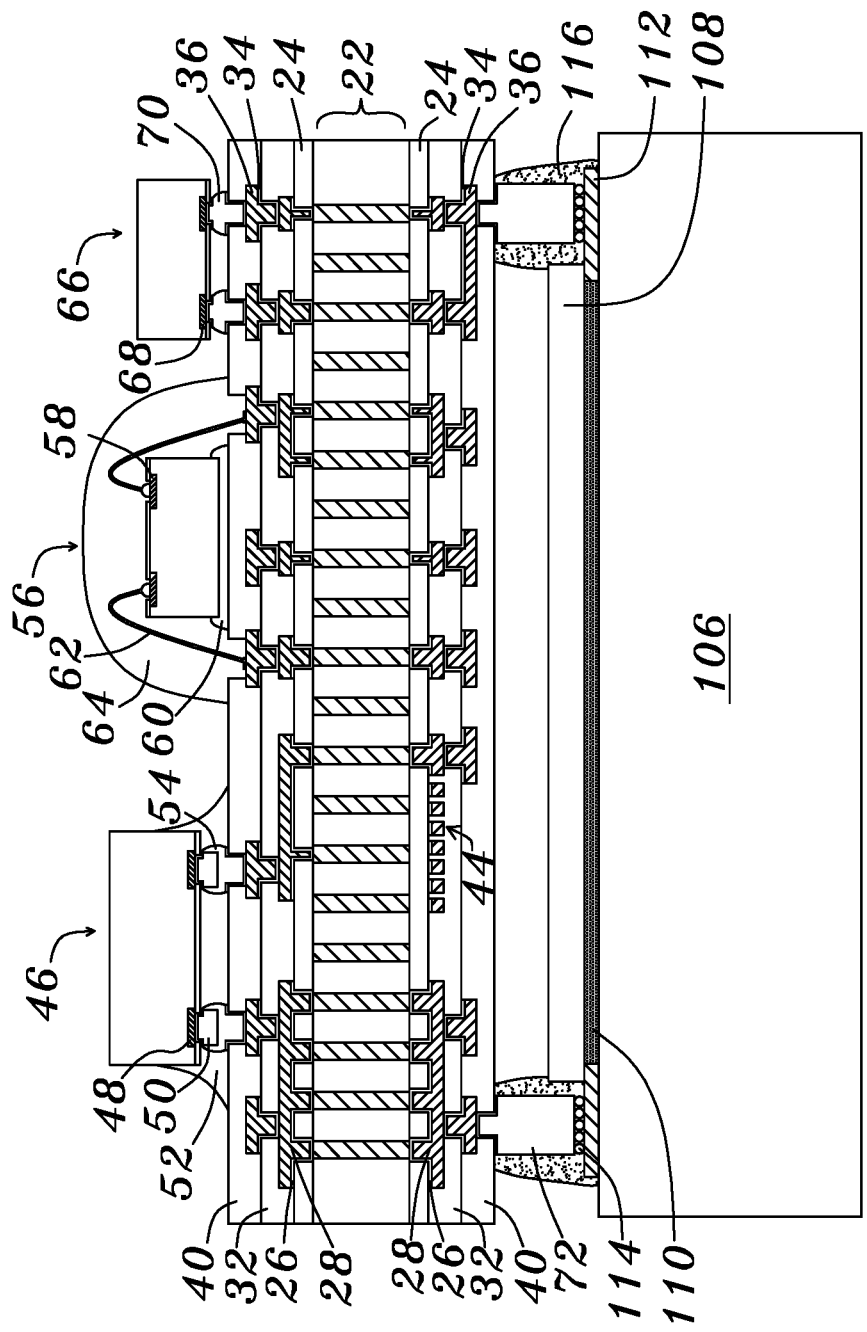
FIG. 21 illustrates a cross-section view of the glass substrate formed on an OLED display substrate, in accordance with the present disclosure.

Referring to FIG. 21, the first substrate 20 is connected to a OLED display substrate through COG bonding process, wherein the OLED display substrate comprises a first glass substrate 106, a second glass substrate 108, an organic light-emitting diodes layer 110 (or a polymer light-emitting diodes layer, PLED layer) between the first glass substrate 106 and the second glass substrate 108 and multiple transparent electrodes 112. The metal bumps 72 are connected to the electrodes 112 through an anisotropic conductive film (ACF) layer 116. The OLED display substrate comprises multiple OLED display panels. The OLED display substrate may comprise touch screen function.

Next, cutting the first substrate 20 and the OLED display substrate to produce multiple package units.

Figure 22:
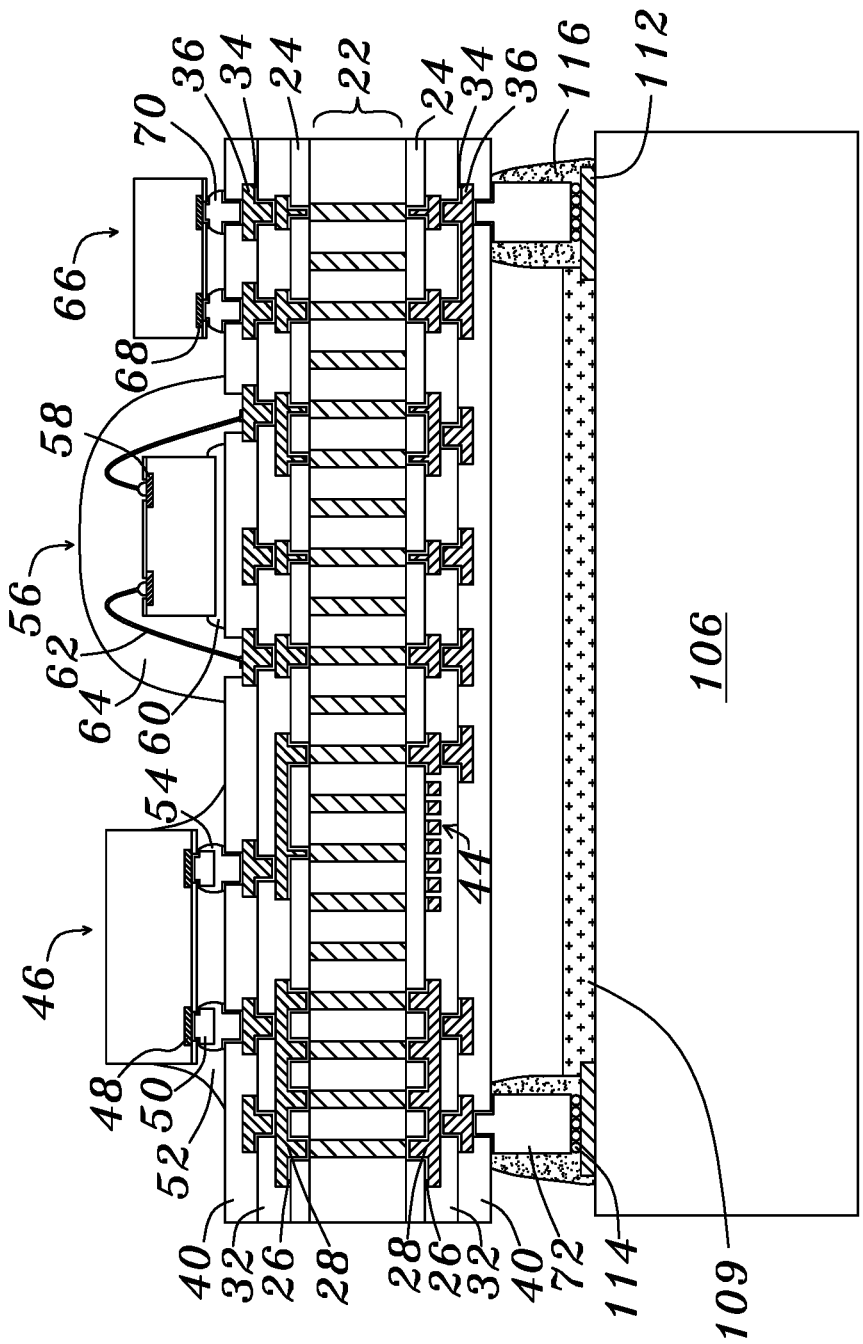
FIG. 22 illustrates a cross-section view of the glass substrate formed on a MEMs display substrate, in accordance with the present disclosure.

Furthermore, the OLED display substrate can be replaced to a Micro Electro Mechanical Systems (MEMS) display substrate. Please referring to FIG. 22, the first substrate 20 is connected to a MEMS display substrate through COG bonding process, wherein the MEMS display substrate comprises a first glass substrate 106, a MEMS layer 109 and multiple transparent electrodes 112 formed on the first glass substrate 106. The metal bumps 72 are connected to the electrodes 112 through an anisotropic conductive film (ACF) layer 116. The MEMS display substrate comprises multiple MEMS display panels. The MEMS display substrate may comprise touch screen function.

Next, cutting the first substrate 20 and the MEMS display substrate to produce multiple package units.

Figure 23:
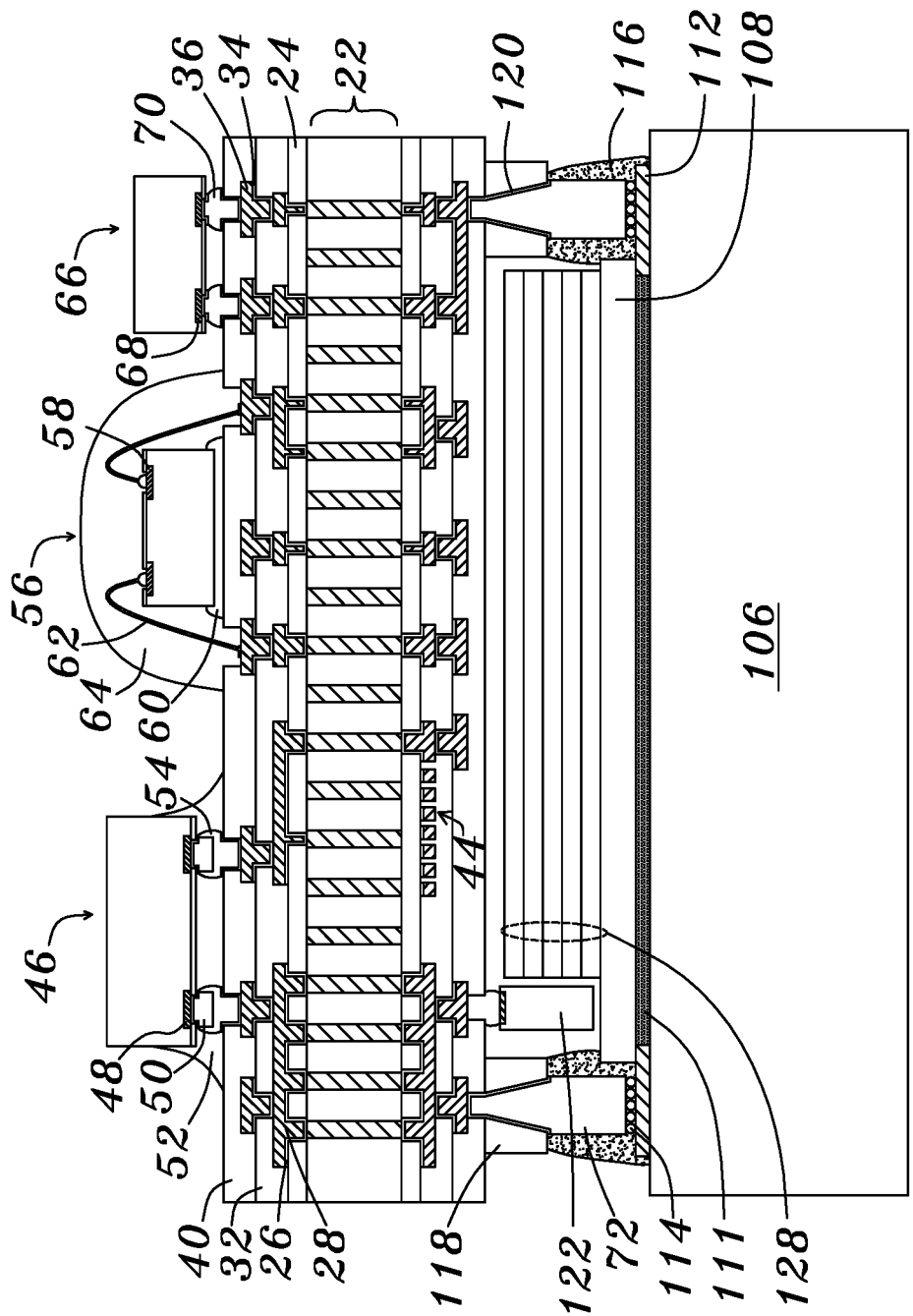
FIG. 23 illustrates a cross-section view of the glass substrate formed on a LCD display substrate, in accordance with the present disclosure.

Referring to FIG. 23, multiple LED devices 122 are packaged on the bottom surface of the first substrate 20. The first substrate 20 is connected to a LCD display substrate through COG bonding process, wherein the LCD display substrate comprises a first glass substrate 106, a second glass substrate 108, and a transistor liquid crystal display layer 111 between the first glass substrate 106 and the second glass substrate 108 and multiple transparent electrodes 112. The metal bumps 72 are connected to the electrodes 112 through an anisotropic conductive film (ACF) layer 116. The LCD display substrate comprises multiple LCD display panels. The LCD display substrate may comprise touch screen function, wherein the LCD display substrate comprise an in-cell TFT LCD substrate. There are multiple layers 128 between the first substrate 20 and LCD display substrate, such as a diffuser sheet layer, a prism sheet layer, a diffuser layer (or diffuser plate) and a reflector layer.

Next, cutting the first substrate 20 and the LCD display substrate to produce multiple package units.

Those described above are the embodiments to exemplify the present disclosure to enable the person skilled in the art to understand, make and use embodiments of the present disclosure. This description, however, is not intended to limit the scope of the present disclosure. Any equivalent modification and variation according to the spirit of the present disclosure is to be also included within the scope of the claims stated below.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure can be implemented in hardware, software, firmware, or any combinations of such, and over one or more networks. Suitable software can include computer-readable or machine-readable instructions for performing methods and techniques (and portions thereof) of designing and/or controlling the fabrication and design of integrated circuit chips according to the present disclosure. Any suitable software language (machine-dependent or machine-independent) may be utilized. Moreover, embodiments of the present disclosure can be included in or carried by various signals, e.g., as transmitted over a wireless radio frequency (RF) or infrared (IR) communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. The scope of protection is limited solely by the claims. That scope is intended and should be interpreted to be as broad as is consistent with the ordinary meaning of the language that is used in the claims when interpreted in light of this specification and the prosecution history that follows and to encompass all structural and functional equivalents.

What is claimed is:

1. A structure comprising:
a first glass substrate having a first surface and a second surface opposed to said first surface, wherein said first surface is parallel to said second surface, multiple metal conductors extending through said first glass substrate beginning at said first surface and ending at said second surface, wherein a first metal layer is under said second surface connected to one of said metal conductors and a bottom most dielectric layer is under said first metal layer, wherein a first metal bump is under said bottom most dielectric layer, wherein said first metal bump is connected to one of said metal conductors through an opening in said bottom most dielectric layer and said first metal layer, wherein said first metal bump comprises a second metal layer and a third metal layer in said opening and under said bottom most dielectric layer;
a first chip over said first surface and connected to said metal bump through one of said metal conductors and said first metal layer; and
a second glass substrate of an organic light-emitting diodes (OLED) display substrate is directly under said first glass substrate and said first chip, wherein said metal bump is between said first and second glass substrates and contacted to an electrode of said OLED display substrate through a conductive layer, wherein said conductive layer is directly between said first and second glass substrates, and wherein said conductive layer directly contacts with said electrode of said OLED display substrate and said first metal bump.

2. The structure of claim 1, wherein said first metal layer comprises a copper layer.

3. The structure of claim 1, wherein said conductive layer comprises an anisotropic conductive film (ACF) layer.

4. The structure of claim 1, wherein said first chip comprises a central-processing-unit (CPU) chip.

5. The structure of claim 1, wherein said electrode is exposed near said OLED display substrate.

6. The structure of claim 1, wherein said first chip comprises a baseband chip.

7. The structure of claim 1, wherein said first chip comprises a logic chip.

8. The structure of claim 1, wherein said second metal layer is between said first and third metal layers, wherein said third metal layer is thicker than said second metal layer.

9. The structure of claim 1, wherein said metal conductor comprises a copper layer.

10. The structure of claim 1, further comprising a second chip and multiple discrete passive components over said first surface, wherein a first contact point of said second chip is electrically coupled with one of said metal conductors and a second contact point of said discrete passive component is electrically coupled with one of said metal conductors.

11. The structure of claim 1, further comprising a second chip and a third chip over said first surface, wherein said third chip is over said second chip, wherein a through-silicon-via metal layer in said second chip.

12. The structure of claim 1, wherein said first glass substrate comprises a solid glass core has a glass transition temperature between 300° C. and 900° C.

13. The structure of claim 1, wherein said metal conductor comprises a first edge and a second edge opposite to and substantially parallel with said first edge.

14. The structure of claim 1, wherein said one of said metal conductors comprise a top end and a bottom end, wherein said top and bottom ends have substantially the same width.

15. The structure of claim 1, wherein said one of said metal conductors comprise a top surface and a bottom surface, wherein said top and bottom surfaces have substantially the same area size.

16. The structure of claim 1, further comprises a fourth metal layer over said first surface connected to one of said metal conductors and said first chip, wherein said fourth metal layer is between one of said metal conductors and said first chip.

17. The structure of claim 16, wherein said fourth metal layer comprises a copper layer.

18. The structure of claim 1, wherein said third metal layer comprises an electroplated layer, wherein said electroplated layer comprises a copper layer.

19. The structure of claim 1, wherein said third metal layer comprises an electroplated layer, wherein said electroplated layer comprises a gold layer.

20. The structure of claim 1, wherein said second metal layer comprises a copper layer, wherein said third metal layer comprises a solder layer, and wherein said second metal layer is between said first and third metal layers.

* * * * *